United States Patent
Zhang et al.

(10) Patent No.: US 12,100,771 B1
(45) Date of Patent: Sep. 24, 2024

(54) SOLAR CELL, METHOD FOR PREPARING SOLAR CELL, AND PHOTOVOLTAIC MODULE

(71) Applicants: JINKO SOLAR (HAINING) CO., LTD., Haining (CN); ZHEJIANG JINKO SOLAR CO., LTD., Zhejiang (CN)

(72) Inventors: Bike Zhang, Haining (CN); Nannan Yang, Haining (CN); Mengwei Xu, Haining (CN); Jingsheng Jin, Haining (CN)

(73) Assignees: JINKO SOLAR (HAINING) CO., LTD., Haining Zhejiang (CN); ZHEJIANG JINKO SOLAR CO., LTD., Haining Zhejiang (CN)

( * ) Notice: Subject to any disclaimer, the term of this patent is extended or adjusted under 35 U.S.C. 154(b) by 0 days.

(21) Appl. No.: 18/332,728

(22) Filed: Jun. 10, 2023

(30) Foreign Application Priority Data

Apr. 21, 2023 (CN) .......................... 202310440972.1

(51) Int. Cl.
  *H01L 31/02* (2006.01)
  *H01L 31/0203* (2014.01)
  (Continued)

(52) U.S. Cl.
  CPC .... *H01L 31/02008* (2013.01); *H01L 31/0203* (2013.01); *H01L 31/035209* (2013.01);
  (Continued)

(58) Field of Classification Search
  CPC .......................... H01L 31/1816; H01L 31/1868
  See application file for complete search history.

(56) References Cited

U.S. PATENT DOCUMENTS

| | | | | | |
|---|---|---|---|---|---|
| 5,053,083 | A | * | 10/1991 | Sinton | ................. H01L 31/1804 257/E31.039 |
| 2003/0153165 | A1 | * | 8/2003 | Kondo | ................. C23C 16/505 257/E31.046 |

(Continued)

FOREIGN PATENT DOCUMENTS

| | | |
|---|---|---|
| CN | 208954997 U | 6/2019 |
| CN | 112349798 A | 2/2021 |

(Continued)

OTHER PUBLICATIONS

Jinko Solar (Haining) Co., Ltd., et al., Extended European Search Report, EP 23178053.7, Dec. 12, 2023, 11 pgs.

*Primary Examiner* — Sadie White
(74) *Attorney, Agent, or Firm* — USCH Law, PC

(57) ABSTRACT

The solar cell includes a substrate, a tunneling layer disposed on a first surface, and a first doped conductive layer disposed on a surface of the tunneling layer. The solar cell further includes a second doped conductive layer disposed on a surface of the first doped conductive layer, where the second doped conductive layer includes: multiple first portions and multiple second portions arranged alternately in a direction perpendicular to a predetermined direction and perpendicular to a thickness direction of the second doped conductive layer, each of the multiple first portions and the multiple second portions extends along the predetermined direction, a doping element concentration of the first doped conductive layer is lower than a doping element concentration of each of the multiple first portions, and the doping element concentration of each of the multiple first portions is lower than a doping element concentration of each of the multiple second portions.

17 Claims, 11 Drawing Sheets

(51) Int. Cl.
*H01L 31/0352* (2006.01)
*H01L 31/0376* (2006.01)
*H01L 31/18* (2006.01)

(52) U.S. Cl.
CPC ...... *H01L 31/1816* (2013.01); *H01L 31/1868* (2013.01); *H01L 31/0376* (2013.01)

(56) References Cited

U.S. PATENT DOCUMENTS

| | | | |
|---|---|---|---|
| 2012/0073647 A1* | 3/2012 | Stangl | H01L 31/186 257/E31.124 |
| 2012/0225515 A1* | 9/2012 | Moslehi | H01L 31/1896 257/E31.127 |
| 2014/0299187 A1* | 10/2014 | Chang | H01L 31/02168 136/258 |
| 2015/0007879 A1* | 1/2015 | Kwon | H01L 31/028 438/96 |
| 2016/0284913 A1* | 9/2016 | Westerberg | H01L 31/0682 |
| 2016/0351737 A1* | 12/2016 | Chung | H01L 31/022441 |
| 2017/0062633 A1* | 3/2017 | Carlson | H01L 31/022441 |
| 2017/0179325 A1* | 6/2017 | Chung | H01L 31/022441 |
| 2018/0019365 A1* | 1/2018 | Jonczyk | C30B 29/06 |
| 2019/0326452 A1* | 10/2019 | Chang | H01L 31/1804 |
| 2022/0140160 A1 | 5/2022 | Jin et al. | |

FOREIGN PATENT DOCUMENTS

| | | |
|---|---|---|
| CN | 114597267 A | 6/2022 |
| CN | 217280796 U | 8/2022 |
| CN | 115000213 A | 9/2022 |
| CN | 115148857 A | 10/2022 |
| CN | 115241299 A | 10/2022 |
| CN | 115274868 A | 11/2022 |
| CN | 115692533 A | 2/2023 |
| CN | 218548445 U | 2/2023 |
| CN | 115810688 A | 3/2023 |
| CN | 115842062 A | 3/2023 |
| CN | 115985980 A | 4/2023 |
| EP | 3193376 A1 | 7/2017 |
| EP | 4002487 A1 | 5/2022 |
| JP | H07263340 A | 10/1995 |
| JP | 2016103642 A | 6/2016 |
| JP | 2018107468 A | 7/2018 |
| JP | 2019117963 A | 7/2019 |
| JP | 2022073810 A | 5/2022 |
| JP | 2022081367 A | 5/2022 |
| JP | 2023033253 A | 3/2023 |

* cited by examiner

US 12,100,771 B1

SOLAR CELL, METHOD FOR PREPARING SOLAR CELL, AND PHOTOVOLTAIC MODULE

CROSS-REFERENCE TO RELATED APPLICATION

The present application claims the benefit of priority under the Paris Convention to Chinese Patent Application No. 202310440972.1 filed on Apr. 21, 2023, which is incorporated herein by reference in its entirety.

TECHNICAL FIELD

Embodiments of the present application relate to the technical field of solar cells, and in particular to a solar cell, a method for preparing a solar cell, and a photovoltaic module.

BACKGROUND

A solar cell has desirable photoelectric conversion capability. At present, a tunneling layer and a doped conductive layer are prepared on a surface of a substrate to suppress carrier recombination on the surface of the substrate and enhance the passivation effect on the substrate in the solar cell. Among them, the tunneling layer has desirable chemical passivation effect, and the doped conductive layer has desirable field passivation effect.

There are doping elements with a certain concentration of the doped conductive layer, which can form a sufficiently high potential barrier between the doped conductive layer and the substrate. This barrier can make it easier for majority carriers in the substrate to tunnel through the tunneling layer, which allows minority carriers in the substrate to escape the interface, reduces the minority carrier concentration, to achieve selective carrier transport. Therefore, the concentration of doping elements in the doped conductive layer plays an important role in the performance of the doped conductive layer, which may affect the overall performance of the solar cell.

However, the photoelectric conversion performance of the solar cell in the conventional art is still poor.

SUMMARY

Embodiments of the present application provide a solar cell, a method for preparing a solar cell, and a photovoltaic module, which are at least conducive to improving the photoelectric conversion performance of the solar cell.

A solar cell is provided according to the embodiments of the present application, the solar cell includes a substrate having a first surface, a tunneling layer formed on the first surface, and a first doped conductive layer formed on the tunneling layer. The solar cell further includes a second doped conductive layer formed on the first doped conductive layer, where the second doped conductive layer includes: multiple first portions and multiple second portions arranged alternately in a direction perpendicular to a predetermined direction and perpendicular to a thickness direction of the second doped conductive layer, each of the multiple first portions and the multiple second portions extends along the predetermined direction, a doping element concentration of the first doped conductive layer is lower than a doping element concentration of each of the multiple first portions, and the doping element concentration of each of the multiple first portions is lower than a doping element concentration of each of the multiple second portions. The predetermined direction is parallel to the first surface. The solar cell further includes multiple first electrodes corresponding, respectively, to the multiple second portions. Each of the multiple first electrodes extends along the predetermined direction, and each of the multiple first electrodes is in electrical contact with a corresponding second portion of the multiple second portions.

In some embodiments, a ratio of the doping element concentration of the first portion to the doping element concentration of the second portion ranges from 1:50 to 3:4.

In some embodiments, a ratio of the doping element concentration of the first doped conductive layer to the doping element concentration of the second portion ranges from 1:100 to 1:2.

In some embodiments, the first doped conductive layer includes multiple third portions and multiple fourth portions arranged alternately in a direction perpendicular to a predetermined direction and perpendicular to a thickness direction of the second doped conductive layer, each of the multiple third portions and the multiple fourth portions extends along the predetermined direction, and the predetermined direction is any direction parallel to the first surface; each of the multiple third portions is disposed directly opposite to each of the multiple first portions, each of the multiple fourth portions is disposed directly opposite to each of the multiple second portions, and a doping element concentration of each of the multiple third portions is lower than a doping element concentration of each of the multiple fourth portions.

In some embodiments, in response to the first doped conductive layer having N-type doping elements, a ratio of the doping element concentration of each of the multiple third portions to the doping element concentration of each of the multiple fourth portions ranges from 1:30 to 5:6; in response to the first doped conductive layer having N-type doping elements, a ratio of the doping element concentration of each of the multiple third portions to the doping element concentration of each of the multiple fourth portions ranges from 1:100 to 2:3.

In some embodiments, a ratio of the doping element concentration of each of the multiple fourth portions to the doping element concentration of each of the multiple second portions ranges from 1:10 to 5:6.

In some embodiments, the first doped conductive layer and the second doped conductive layer both have P-type doping elements, the doping element concentration of each of the multiple first portions ranges from $5\times10^{18}$ atom/$cm^3$ to $5\times10^{19}$ atom/$cm^3$, the doping element concentration of each of the multiple first portions ranges from $5\times10^{19}$ atom/$cm^3$ to $3\times10^{20}$ atom/$cm^3$, and the doping element concentration of the first doped conductive layer ranges from $1\times10^{18}$ atom/$cm^3$ to $4.5\times10^{19}$ atom/$cm^3$.

In some embodiments, the first doped conductive layer and the second doped conductive layer both have N-type doping elements, the doping element concentration of each of the multiple first portions ranges from $1\times10^{20}$ atom/$cm^3$ to $2\times10^{21}$ atom/$cm^3$, the doping element concentration of each of the multiple first portions ranges from $2\times10^{20}$ atom/$cm^3$ to $5\times10^{21}$ atom/$cm^3$, and the doping element concentration of the first doped conductive layer ranges from $5\times10^{19}$ atom/$cm^3$ to $5\times10^{20}$ atom/$cm^3$.

In some embodiments, the solar cell further includes a blocking layer located between the first doped conductive layer and the second doped conductive layer, where a surface of the blocking layer facing towards the substrate is in contact with the surface of the first doped conductive layer away from the substrate, and a surface of the blocking layer away from the substrate is in contact with a surface of the second doped conductive layer facing towards the substrate.

In some embodiments, the surface of the blocking layer away from the substrate is in contact with each of the multiple second portions, and an orthographic projection of the blocking layer on the first surface completely overlaps with an orthographic projection of each of the multiple second portions on the first surface.

In some embodiments, the surface of the blocking layer away from the substrate is in contact with each of the multiple first portions and each of the multiple second portions, and an orthographic projection of the blocking layer on the first surface completely overlaps with an orthographic projection of each of the multiple first portions on the first surface and an orthographic projection of each of the multiple second portions on the first surface.

In some embodiments, a material of the blocking layer includes at least one of silicon oxide, silicon nitride, silicon oxynitride, silicon carbide or magnesium fluoride.

In some embodiments, a material of the first doped conductive layer includes at least one of amorphous silicon, polycrystalline silicon, or silicon carbide, and a material of the second doped conductive layer includes at least one of amorphous silicon, polycrystalline silicon, or silicon carbide.

In some embodiments, the first doped conductive layer is composed of a first polycrystalline silicon, each of the multiple first portions is composed of a second polycrystalline silicon, and each of the multiple the second portions is composed of a third polycrystalline silicon; an average grain size of the first polycrystalline silicon is greater than an average grain size of the second polycrystalline silicon, and is greater than an average grain size of the third polycrystalline silicon.

In some embodiments, each of the multiple third portions is composed of a fourth polycrystalline silicon, each of the multiple fourth portions is composed of a fifth polycrystalline silicon, each of the multiple first portions is composed of a second polycrystalline silicon, and each of the multiple second portions is composed of a third polycrystalline silicon. An average grain size of the fourth polycrystalline silicon is greater than an average grain size of the fifth polycrystalline silicon, the average grain size of the fifth polycrystalline silicon is greater than an average grain size of the third polycrystalline silicon, and an average grain size of the second polycrystalline silicon is greater than the average grain size of the third polycrystalline silicon.

In addition, the substrate has N-type doping elements, each of the multiple second portions includes a main body portion doped with N-type doping elements and a reverse doped portion located in the main body portion and doped with P-type doping elements, and a volume proportion of the reverse doped portion in the main body portion is less than 50%.

In some embodiments, a ratio of a thickness of the first doped conductive layer to a thickness of the second doped conductive layer ranges from 2:1 to 1:12.

Correspondingly, a photovoltaic module is further provided according to the embodiments of the present application, the photovoltaic module includes at least one cell string, where the at least one cell string is formed by connecting multiple solar cells with each other, each of the multiple solar cells includes at least one solar cell according to any one above. The photovoltaic module further includes at least one encapsulation layer configured to cover the at least one cell string, and at least one cover plate configured to cover the at least one encapsulation layer.

Correspondingly, a method for preparing a solar cell is further provided according to the embodiments of the present application, and the method includes: providing a substrate having a first surface; forming a tunneling layer on the first surface; forming a first doped conductive layer on the tunneling layer; forming a second doped conductive layer on the first doped conductive layer, where the second doped conductive layer includes: multiple first portions and multiple second portions arranged alternately in a direction perpendicular to a predetermined direction and perpendicular to a thickness direction of the second doped conductive layer, each of the multiple first portions and the multiple second portions extends along the predetermined direction, a doping element concentration of the first doped conductive layer is lower than a doping element concentration of each of the multiple first portions, and the doping element concentration of each of the multiple first portions is lower than a doping element concentration of each of the multiple second portions. The predetermined direction is parallel to the first surface. The method further includes forming multiple first electrodes corresponding, respectively, to the multiple second portions. Each of the multiple first electrodes extends along the predetermined direction, and each of the multiple first electrodes is in electrical contact with a corresponding second portion in the multiple second portions.

In some embodiments, before forming the second doped conductive layer on the surface of the first doped conductive layer away from the substrate, the method further includes: forming a blocking layer on the surface of the first doped conductive layer away from the substrate. A material of the blocking layer includes at least one of silicon oxide, silicon nitride, silicon oxynitride or silicon carbide.

In some embodiments, forming the first doped conductive layer on the surface of the tunneling layer away from the substrate, forming the second doped conductive layer on the surface of the first doped conductive layer away from the substrate, and forming the blocking layer on the surface of the first doped conductive layer away from the substrate include: forming a first intrinsic silicon layer on a surface of the tunneling layer away from the substrate; forming the blocking layer on a surface of the first intrinsic silicon layer away from the substrate; forming a second intrinsic silicon layer on a surface of the blocking layer away from the substrate; depositing a doping source on a surface of the second intrinsic silicon layer away from the substrate and simultaneously introducing oxygen to convert a part of the second intrinsic silicon layer into a glass layer in a thickness direction of the second intrinsic silicon layer, where the doping source includes first doping elements, and the glass layer is a silicon oxide layer having the first doping elements; performing a first doping process, where the first doping process includes diffusing a part of the first doping elements stored in the glass layer into the first intrinsic silicon layer to form the first doped conductive layer, and diffusing another part of the first doping elements into the second intrinsic silicon layer other than the glass layer to form an initial second doped conductive layer; and performing a second doping process on a part of the glass layer, where the second doping process includes diffusing remaining first doping elements stored in the glass layer into the initial second doped conductive layer in a direction perpendicular to the first surface to convert one part of the initial second doped conductive layer into the multiple second portions of the second doped conductive layer, and convert the other part of the initial second doped conductive layer into the multiple first portions of the second doped conductive layer.

In some embodiments, the second doping process includes a laser process, the laser process has a laser wavelength of 300 nm to 532 nm, a laser frequency of 120 kHz to 1500 kHz, a scanning rate of 1000 mm/s to 40000 mm/s, and a laser energy of 0.1 J/cm$^2$ to 1.5 J/cm$^2$.

BRIEF DESCRIPTION OF THE DRAWINGS

One or more embodiments are described as examples with reference to the corresponding figures in the accompanying drawings, and the exemplary description does not constitute a limitation to the embodiments. The figures in the accompanying drawings do not constitute a proportion limitation unless otherwise stated. For more clearly illustrating embodiments of the present disclosure or the technical solutions in the conventional technology, drawings referred to for describing the embodiments or the conventional technology will be briefly described hereinafter. Apparently, drawings in the following description are only examples of the present disclosure, and for the person skilled in the art, other drawings may be acquired based on the provided drawings without any creative efforts.

DETAILED DESCRIPTION

It is known from the background technology that the photoelectric conversion efficiency of the solar cell in the conventional art is poor.

Figure 1:
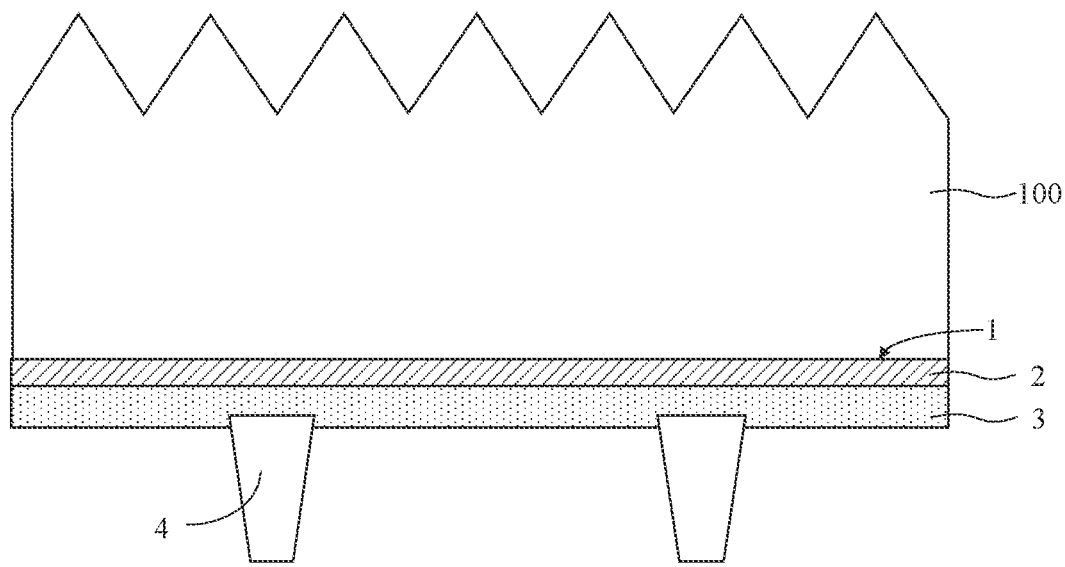
FIG. 1 is a cross-sectional view of a solar cell in the conventional art.

It can be found in the analysis that one of the reasons for the low photoelectric conversion efficiency of the solar cells in the conventional art is as follows. Referring to FIG. 1, in a tunnel oxide passivated contact (TOPCON) cell, a first surface 1 of a substrate 100 has a passivation contact structure, which includes a tunneling layer 2 and a doped conductive layer 3. Among them, the doped conductive layer 3 has doping elements of a certain concentration, thereby forming an energy band bending on the surface of substrate 100 to achieve selective carrier transport. A metal electrode 4 is in electrical contact with the doped conductive layer 3. The carriers in the substrate 100 are transferred to the doped conductive layer 3 and collected by the metal electrode 4. The doping elements concentration of the doped conductive layer 3 is a key factor in controlling the performance of the doped conductive layer 3. The low doping element concentration prevents the formation of a sufficiently high potential barrier between the doped conductive layer 3 and the substrate 100, resulting in the inability of carriers in the substrate 100 to penetrate the tunneling layer 2 for tunneling, which causes a sharp decrease in the collection efficiency of carriers. However, excessive doping element concentration of the doped conductive layer 3 may lead to severe parasitic absorption of incident light by the doped conductive layer 3, resulting in lower utilization of incident light by substrate 100 and a serious decrease in the passivation quality of the doped conductive layer 3. Therefore, controlling the doping element concentration of the doped conductive layer 3 is the key to improve the photoelectric conversion performance of the solar cell.

A solar cell is provided according to the embodiments of the present application, in which the doping element concentration of the first doped conductive layer is lower than that in the second doped conductive layer, to reduce the probability of doping elements in the first doped conductive layer entering the tunneling layer and ensure that the tunneling layer has desirable tunneling performance. In addition, in the direction perpendicular to the first surface, the multiple first portions and the multiple second portions form a concentration gradient with the first doped conductive layer, which is conducive to driving the longitudinal transmission of carriers and enhancing the transmission of carriers in the substrate to the second doped conductive layer, to enhance the ability of the first electrode to collect carriers. The doping element concentration of each of the multiple first portions is lower than the doping element concentration of each of the multiple second portions. That is, a concentration gradient is formed between the multiple first portions and the multiple second portions, which is conducive to enhancing the lateral transmission of carriers in the second doped conductive layer, enhancing the collection ability of the first electrode for carriers. Moreover, the doping element concentration of each of the multiple second portions is relatively high, which can reduce the contact recombination loss of carriers between the first electrode and the multiple second portions. The doping element concentration of each of the multiple first portions is relatively small, which reduces the parasitic absorption of incident light by a part of the multiple first portion that is not in contact with the first electrode, to improve the utilization rate of incident light by the substrate. By controlling the doping element concentration of the first doped conductive layer, and controlling the doping element concentration of each of the multiple first portions and the doping element concentration of each of the multiple second portions in the second doped conductive layer, the interaction between the first doped conductive layer, the multiple first portions and the multiple second portions with different doping element concentrations is achieved, to improve the carrier transport ability, thereby integrally improving the photoelectric conversion performance of the solar cell.

The embodiments of the present disclosure will be described in detail below with reference to the accompanying drawings. However, those skilled in the art may appreciate that, in the various embodiments of the present disclosure, numerous technical details are set forth in order to provide the reader with a better understanding of the present disclosure. However, the technical solutions claimed in the present disclosure may be implemented without these technical details and various changes and modifications based on the following embodiments.

Figure 2:
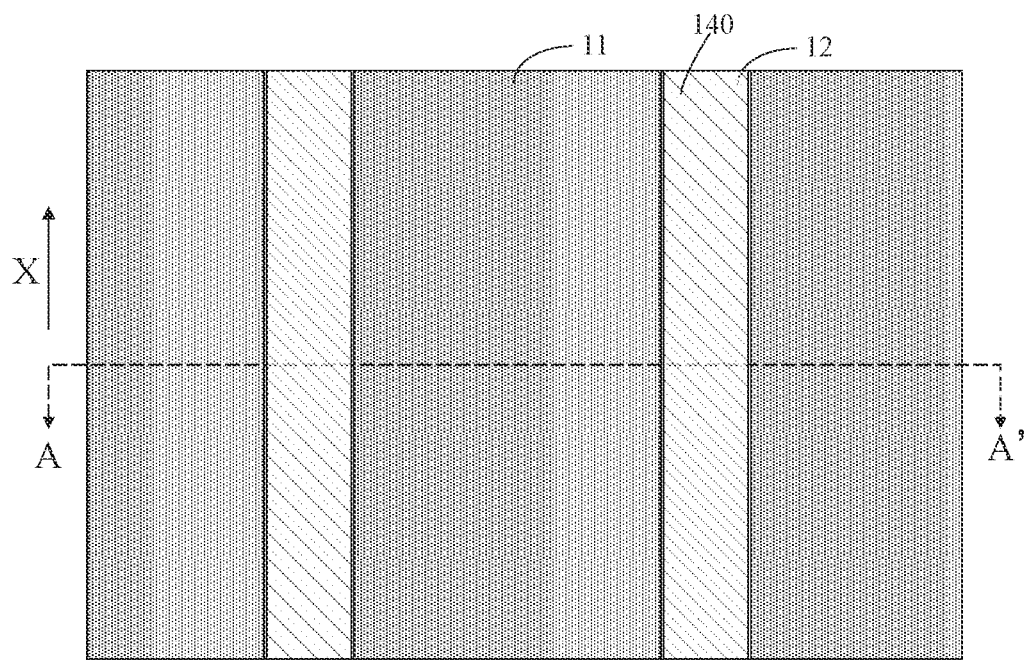
FIG. 2 is a top view of a solar cell provided according to an embodiment of the present application.
Figure 3:
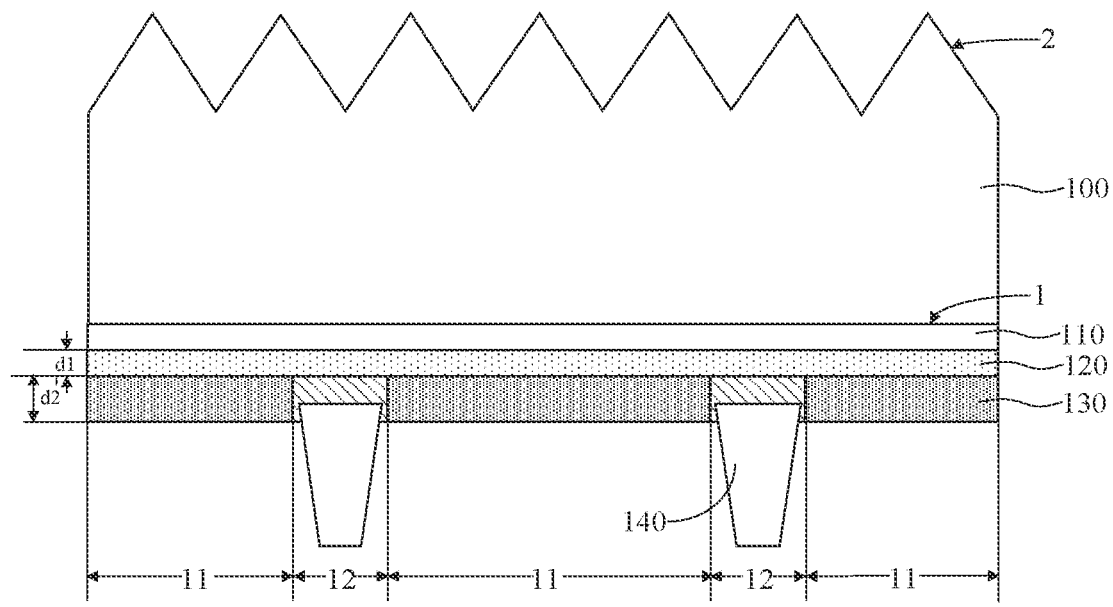
FIG. 3 is a cross-sectional view of a first solar cell provided according to an embodiment of the present application.

FIG. 2 is a top view of a solar cell provided according to an embodiment of the present application. FIG. 3 is a cross-sectional view of a first solar cell provided according to an embodiment of the present application, and FIG. 3 is a cross-sectional view of the solar cell shown in FIG. 2 along the AA' direction.

Referring to FIG. 2 to FIG. 3, the solar cell includes a substrate 100 having a first surface 1, and a tunneling layer 110 formed on the first surface 1. The solar cell further includes a first doped conductive layer 120 formed on the tunneling layer 110. The solar cell further includes a second doped conductive layer 130 formed on the first doped conductive layer 120. The second doped conductive layer 130 includes multiple first portions 11 and multiple second portions 12 arranged alternately in a direction perpendicular to a predetermined direction X and perpendicular to a thickness direction of the second doped conductive layer 130. Each of the multiple first portions 11 and the multiple second portions 12 extends along the predetermined direction X, a doping element concentration of the first doped conductive layer 120 is lower than a doping element concentration of each of the multiple first portions 11, and the doping element concentration of each of the multiple first portions 11 is lower than a doping element concentration of each of the multiple second portions 12. The predetermined direction X is parallel to the first surface 1. The solar cell further includes multiple first electrodes corresponding, respectively, to the multiple second portions. Each of the multiple first electrodes extends along the predetermined direction X, and each of the multiple first electrodes is in electrical contact with a corresponding second portion 12 in the multiple second portions 12.

The substrate 100 is configured to receive incident light and generate photo generated carriers. In some embodiments, the substrate 100 is a silicon substrate, and the material of the silicon substrate includes at least one of monocrystalline silicon, polycrystalline silicon, amorphous silicon, or microcrystalline silicon. In some embodiments, the material of the substrate 100 may also be a semiconductor material. In some embodiments, the material of the substrate 100 may also be silicon carbide, organic material, or multicomponent compounds. The multicomponent compounds include but are not limited to materials such as perovskite, gallium arsenide, cadmium telluride, copper indium selenium, etc.

In some embodiments, the solar cell is a TOPCON cell, and the solar cell has a substrate 100 having a second surface 2 opposite to the first surface 1. In some embodiments, in response to the solar cell being a double-sided cell, both the first surface 1 and the second surface 2 can be used to receive incident light. In some embodiments, the solar cell is a single sided cell, and either the first surface 1 or the second surface 2 can be used to receive incident light.

In some embodiments, the solar cell is a single sided cell, and the second surface 2 is a light receiving surface. In response to the second surface 2 of the substrate 100 being a light receiving surface, the second surface 2 of the substrate 100 can be set as a textured surface, such as a pyramid textured surface, to reduce the reflectivity of the incoming light on the second surface 2 of the substrate 100, thereby increasing the absorption and utilization of light. In some embodiments, the first surface 1 of the substrate 100 can be a polished surface, that is, the first surface 1 of the substrate 100 is relatively flat compared to the second surface 2 of the substrate 100. In some embodiments, in response to the first surface 1 being a light receiving surface, the first surface 1 can be set as a textured surface, such as a pyramid textured surface, and the second surface 2 can be a polished surface. In some embodiments, the solar cell is a single sided cell, and both the first surface 1 and the second surface 2 can be provided with textured surfaces, such as a pyramid textured surface.

In some embodiments, the solar cell is a double-sided cell, and the second surface 2 of the substrate 100 and the first surface 1 of the substrate 100 are both set as pyramid textured surfaces.

In some embodiments, the substrate 100 has N-type doping elements or P-type doping elements. The N-type doping elements may be group V elements such as phosphorus (P), bismuth (Bi), antimony (Sb), or arsenic (As), while the P-type elements may be group III elements such as boron (B), aluminum (Al), gallium (Ga), or indium (In). For example, in response to the substrate 100 being a P-type substrate, there are P-type doping elements inside the substrate 100. Alternatively, in response to the substrate 100 being a N-type substrate, there are N-type doping elements inside the substrate 100.

A first electrode 140 is in electrical contact with a second portion 12, and the carriers in the substrate 100 are tunneled into the first doped conductive layer 120 through the tunneling layer 110. The carriers in the first doped conductive layer 120 are transmitted to the second portion 12, and are collected by the first electrode 140 in electrical contact with the second portion 12. The carriers in the first doped conductive layer 120 can also be transmitted to the first portion 11, and the carriers in the first portion 11 are transmitted to the second portion 12, and then collected by the first electrode 140 in electrical contact with the second portion 12.

In some embodiments, an orthographic projection of the first electrode 140 on the first surface 1 is located within an orthographic projection of the second portion 12 on the first surface 1, that is, the first electrode 140 has a smaller width than the second portion 12. In some embodiments, the orthographic projection of the first electrode 140 on the first surface 1 may also completely overlap with the orthographic projection of the second portion 12 on the first surface 1. The first portion 11 is the part of the second doped conductive layer 130 except for the second portion 12.

The first doped conductive layer 120 and the second doped conductive layer 130 can form energy band bending on the first surface 1 and form a built-in electric field, so that the potential barrier for majority carriers is lower than that for minority carriers, which causes holes to escape the interface and reduce hole concentration. The majority carriers in the substrate 100 can easily tunnel through the tunneling layer 110 to the first doped conductive layer 120 and the second doped conductive layer 130, to achieve selective carrier transmission.

The first doped conductive layer 120 is closer to the tunneling layer 110 than the second doped conductive layer 130, and the doping element concentration of the first doped conductive layer 120 is lower than that of the second doped conductive layer 130, which can reduce the probability of doping elements in the first doped conductive layer 120 entering the tunneling layer 110, and ensure that the tunneling layer 110 has desirable tunneling performance, thereby ensuring that there is a large number of carriers tunneling through the tunneling layer 110 from the substrate 100, and that the tunneling layer 110 has a desirable chemical passivation effect on the first surface 1.

The doping elements referred to here are the doping elements in the first doped conductive layer 120. In response to the doping element concentration being excessive, the doping elements in the first doped conductive layer 120 will diffuse towards the tunneling layer 110, to form doping elements in the tunneling layer 110, which affects the tunneling performance of the tunneling layer 110, and causes a sharp decrease in the passivation ability of the tunneling layer 110 on the first surface 1, resulting in a sharp increase in the Auger recombination of the first surface 1. In some embodiments, the material of the tunneling layer 110 includes at least one of silicon oxide, aluminum oxide, silicon nitride, silicon oxynitride, amorphous silicon or polycrystalline silicon.

The second doped conductive layer 130 includes the multiple first portion 11 and the multiple second portions 12. The doping element concentration of each of the multiple first portions 11 and the doping element concentration of each of the multiple second portions 12 are both greater than that of the first doped conductive layer 120, so that in the direction perpendicular to the first surface 1, both the multiple first portions 11 and the multiple second portions 12 form a concentration gradient with the first doped conductive layer 120. That is, equivalent to the second doped conductive layer 130 forming a surface field on the surface of the first doped conductive layer 120, to achieve selective transport of carriers from the first doped conductive layer 120 to the second doped conductive layer 130. In this way, it is beneficial to enhance the longitudinal transmission of carriers, enhance the transmission of carriers from the substrate 100 to the second doped conductive layer 130, which increases the number of carriers transmitted to the second doped conductive layer 130, and thereby increasing the number of carriers collected by the first electrode 140, improving the short circuit current and the open circuit voltage of the solar cell, and improving the photoelectric conversion performance of the solar cell.

The doping element concentration of each of the multiple first portions 11 is lower than the doping element concentration of each of the multiple second portions 12. That is, in the direction perpendicular to a predetermined direction X and perpendicular to a thickness direction of the second doped conductive layer 130, a concentration gradient is formed between the multiple first portions 11 and the multiple second portions 12, so that a built to in electric filed is formed inside the second doped conductive layer 130, to enhance the transmission of carriers from the multiple first portions 11 to the multiple second portions 12, thereby enabling the carriers in a part of the second doped conductive layer 130 that is not in contact with the first electrode 140 to be transmitted into the multiple second portions 12, and to be collected by the first electrode 140. In this way, the number of carriers can be collected by the first electrode 140 can be increased, and the short circuit current and the open circuit voltage of the solar cell are further improved.

The doping element concentration of each of the multiple second portions 12 is higher than that of each of the multiple first portions 11, so that the sheet resistance of each of the multiple second portions 12 is smaller compared to that of each of the multiple first portions 11, thus reducing the contact resistance between the first electrode 140 and the multiple second portions 12, which is conducive to achieving desirable Ohmic contact between the first electrode 140 and the multiple second portions 12, reducing the contact recombination loss between the first electrode 140 and the multiple second portions 12, reducing the transmission loss of carriers to the first electrode 140, and improving the collection capacity of carriers by the first electrode 140. The doping element concentration of each of the multiple first portions 11 is relatively low, to reduce the parasitic absorption of incident light by a part of the multiple first portions 11 that is not in contact with the first electrode 140, thereby improving the utilization rate of incident light by the substrate 100, and improving the photoelectric conversion performance of the solar cell.

In some embodiments, the first doped conductive layer 120 has doping element of the same type as the substrate 100, and the second doped conductive layer 130 has doping element of the same type as the substrate 100. In this way, the first doped conductive layer 120 and the second doped conductive layer 130 can form an energy band bending on the first surface 1 of the substrate 100, to achieve selective carrier transport. In some embodiments, in response to the doping elements of the substrate 100 being P-type doping elements, the doping elements in the first doped conductive layer 120 and the second doped conductive layer 130 are both P-type doping elements. In some embodiments, in response to the doping elements of the substrate 100 being N-type doping elements, the doping elements in the first doped conductive layer 120 and the second doped conductive layer 130 are both N-type doping elements. The doping elements in the first doped conductive layer 120 and the second doped conductive layer 130 can be the same or different.

The embodiments of the present application do not limit the specific doping elements of the first doped conductive layer 120 and the second doped conductive layer 130, only to meet the requirement that the doping element types of the first doped conductive layer 120 and the second doped conductive layer 130 are the same as those of the substrate 100. For example, the P-type doping elements may be any of the III group elements such as boron (B), aluminum (Al), gallium (Ga), or gallium (In). N-type doping elements may be any of the V group elements such as phosphorus (P), bismuth (Bi), antimony (Sb), or arsenic (As).

In some embodiments, the ratio of the doping element concentration of the first portion to the doping element concentration of the second portion ranges from 1:50 to 3:4, for example, from 1:50 to 1:45, 1:45 to 1:40, 1:40 to 1:30, 1:30 to 1:25, 1:25 to 1:20, 1:20 to 1:15, 1:15 to 1:10, 1:10 to 1:5, 1:5 to 1:3, 1:3 to 1:2, 1:2 to 2:3, or 2:3 to 3:4. Within the above range, the doping element concentration of the second portion 12 is greater than that of the first portion 11, resulting in a smaller sheet resistance of the second portion 12 compared to the first portion 11. The second portion 12 can have a smaller contact resistance with the first electrode 140, which improves the ohmic contact between the second portion 12 and the first electrode 140, reduces the metal contact composite loss between the first electrode 140 and the second portion 12, and reduces the transmission loss of carriers towards the first electrode 140.

Within the above range, the doping element concentration of the second portion 12 is not excessive compared to that in the first portion 11, to prevent damage to the passivation performance of the second portion 12 due to the excessive doping element concentration of the second portion 12, which improves the ohmic contact between the second portion 12 and the first electrode 140 while maintaining desirable passivation performance of the second portion 12. The passivation performance includes passivation of the first surface 1 and passivation of the contact interface between the first electrode 140 and the second electrode.

Within the above range, the doping element concentration of the first portion 11 is smaller than that of the second portion 12, which makes the parasitic absorption ability of the first portion 11 to incident light weaker, ensures that the substrate 100 has desirable absorption and utilization ability to incident light. Moreover, the doping element concentration of the first portion 11 is relatively low. Compared to the second portion 12, the first portion 11 can have better passivation performance on the first surface 1, reduce the Auger recombination of the first surface 1, and suppress the carrier recombination of the first surface 1.

The second doped conductive layer 130 has multiple first portions and multiple second portions, and the doping element concentration of each of the multiple first portion 11 in the multiple first portions is greater than that of each of the multiple second portion 12 in the multiple second portions 12. The ratio of the doping element concentration of each of the multiple first portions 11 to each of the multiple second portions 12 ranges from 1:50 to 3:4.

In some embodiments, the first doped conductive layer 120 and the second doped conductive layer 130 both have P-type doping elements, and the doping element concentration of each of the multiple first portions 11 ranges from $5 \times 10^{18}$ atom/cm$^3$ to $5 \times 10^{19}$ atom/cm$^3$, for example, it may from $5 \times 10^{18}$ atom/cm$^3$ to $9 \times 10^{18}$ atom/cm$^3$, $9 \times 10^{18}$ atom/cm$^3$ to $1 \times 10^{19}$ atom/cm$^3$, $1 \times 10^{19}$ atom/cm$^3$ to $2 \times 10^{19}$ atom/cm$^3$ or $2 \times 10^{19}$ atom/cm$^3$ to $5 \times 10^{19}$ atom/cm$^3$. The doping element concentration of each of the multiple second portions 12 ranges from $5 \times 10^{19}$ atom/cm$^3$ to $3 \times 10^{20}$ atom/cm$^3$, for example, it can from $5 \times 10^{19}$ atom/cm$^3$ to $9 \times 10^{19}$ atom/cm$^3$, $9 \times 10^{19}$ atom/cm$^3$ to $1 \times 10^{20}$ atom/cm$^3$, $1 \times 10^{20}$ atom/cm$^3$ to $2 \times 10^{20}$ atom/cm$^3$ or $2 \times 10^{20}$ atom/cm$^3$ to $3 \times 10^{20}$ atom/cm$^3$. In response to the doping elements being P-type doping elements, within the above range, the multiple first portions 11 and the multiple second portions 12 have desirable passivation performance, and the sheet resistance of the multiple second portions 12 is low, which is conducive to improving the Ohmic contact between the multiple second portions 12 and the first electrode. In some embodiments, P-type doping elements may be boron, aluminum, nitrogen, gallium, or indium.

In some embodiments, the first doped conductive layer 120 and the second doped conductive layer 130 both have N-type doping elements, and the doping element concentration of each of the multiple first portions 11 ranges from $1 \times 10^{20}$ atom/cm$^3$ to $2 \times 10^{21}$ atom/cm$^3$, for example, it may from $1 \times 10^{20}$ atom/cm$^3$ to $2 \times 10^{20}$ atom/cm$^3$, $2 \times 10^{20}$ atom/cm$^3$ to $5 \times 10^{20}$ atom/cm$^3$, $5 \times 10^{20}$ atom/cm$^3$ to $9 \times 10^{20}$ atom/cm$^3$, $9 \times 10^{20}$ atom/cm$^3$ to $1 \times 10^{21}$ atom/cm$^3$ or $1 \times 10^{21}$ atom/cm$^3$ to $2 \times 10^{21}$ atom/cm$^3$. The doping element concentration of each of the multiple second portions 12 ranges from $2 \times 10^{20}$ atom/cm$^3$ to $5 \times 10^{21}$ atom/cm$^3$, for example, it may from $2 \times 10^{20}$ atom/cm$^3$ to $3 \times 10^{20}$ atom/cm$^3$, $3 \times 10^{20}$ atom/cm$^3$ to $5 \times 10^{20}$ atom/cm$^3$, $5 \times 10^{20}$ atom/cm$^3$ to $9 \times 10^{20}$ atom/cm$^3$, $9 \times 10^{20}$ atom/cm$^3$ to $1 \times 10^{21}$ atom/cm$^3$, $1 \times 10^{21}$ atom/cm$^3$ to $3 \times 10^{21}$ atom/cm$^3$ or $3 \times 10^{21}$ atom/cm$^3$ to $5 \times 10^{21}$ atom/cm$^3$. In some embodiments, N-type doping elements may be phosphorus, bismuth, antimony, or arsenic. In response to the doping element type being N-type, within the above range, the multiple first portions 11 and the multiple second portions 12 can have desirable passivation performance, and the sheet resistance of the multiple second portion 12 is low, which improves the Ohmic contact with the first electrode 140.

According to doping elements of different types, the doping element concentration of each of the multiple first portions 11 and the doping element concentration of each of the multiple second portions 12 are designed within the above range, the doping element concentration of each of the multiple first portions 11 is relatively small, which weakens the parasitic absorption of the multiple first portions 11 to the incident light and increases the absorption utilization rate of the substrate 100 to the incident light. Moreover, within the above range, the multiple first portions 11 have desirable passivation performance, which prevents excessive Auger recombination of the first portion 11 on the first surface 1, and suppresses the recombination of carriers on the first surface 1.

Within the above range, the doping element concentration of each of the multiple second portions 12 is relatively high, resulting in a smaller sheet resistance of the multiple second portion 12. Therefore, a desirable ohmic contact can be formed between the multiple second portion 12 and the first electrode 140, to improve the metal contact composite loss between the first electrode 140 and the multiple second portion 12, and reduce the transmission loss of carriers to the first electrode 140. And within the above range, the doping element concentration of each of the multiple second portions 12 is not excessive, which can prevent the serious problem of carrier recombination on the first surface 1 caused by excessive Auger recombination on the first surface 1 due to the excessive doping element concentration of the multiple second portions 12.

Within the above range, the doping element concentration difference between the multiple first portions 11 and the multiple second portions 12 creates a concentration gradient inside the second doped conductive layer 130. The presence of this concentration gradient also creates a built to in electric field from each of the multiple second portions 12 towards each of the multiple first portions 11, enhances the lateral transmission of carriers from the multiple first portions 11 to the second portion 12, and increases the number of carriers collected by the first electrode 140, thereby enhancing the open circuit voltage and the short circuit current of the solar cell, and improving the photoelectric conversion performance of the solar cell.

It is worth noting that the doping element concentration of each of the multiple first portions 11 and the doping element concentration of each of the multiple second portions 12 referred to in the embodiments of the present application refer to a surface doping concentration of a surface of each of the multiple first portions 11 away from the substrate 100 and a surface doping concentration of a surface of each of the multiple second portions 12 away from the substrate 100, respectively. In response to the first doped conductive layer 120 and the second doped conductive layer 130 both have P-type doping elements, the doping element concentration of each first portion 11 in multiple first portions 11 ranges from $5\times10^{18}$ atom/cm$^3$ to $5\times10^{19}$ atom/cm$^3$, and the doping element concentration of each second portion 12 in multiple second portions 12 ranges from $5\times10^{19}$ atom/cm$^3$ to $3\times10^{20}$ atom/cm$^3$. In response to the first doped conductive layer and the second doped conductive layer both have N-type doping elements, the doping element concentration of each first portion 11 in multiple first portions 11 ranges from $1\times10^{20}$ atom/cm$^3$ to $2\times10^{21}$ atom/cm$^3$, and the doping element concentration of each second portion 12 in multiple second portions 12 ranges from $2\times10^{20}$ atom/cm$^3$ to $5\times10^{21}$ atom/cm$^3$.

In some embodiments, the ratio of the doping element concentration of the first doped conductive layer 120 to the doping element concentration of each of the multiple second portions 12 ranges from 1:100 to 1:2, for example, it may from 1:100 to 1:85, 1:85 to 1:70, 1:70 to 1:60, 1:60 to 1:50, 1:50 to 1:40, 1:40 to 1:25, 1:25 to 1:15, 1:15 to 1:10, 1:10 to 1:5, or 1:5 to 1:2. Within the above range, the doping element concentration of the first doped conductive layer 120 is smaller than that of the second portion 12, which can suppress the diffusion of doping elements in the first doped conductive layer 120 to the tunneling layer 110, prevent damage to the tunneling performance and passivation of the tunneling layer 110, and enable the tunneling layer 110 to have a desirable chemical passivation effect on the first surface 1.

In addition, the first doped conductive layer 120 is set close to the tunneling layer 110, and the doping element concentration of the first doped conductive layer 120 is relatively small, which can prevent excessive Auger recombination on the first surface 1 due to the high doping element concentration of the first doped conductive layer 120, resulting in the first doped conductive layer 120 and better suppression of carrier recombination on the first surface 1.

It is worth noting that the doping element concentration of the first doped conductive layer 120 referred to in the embodiment of the present application refers to the surface doping concentration of the first doped conductive layer 120 away from the substrate 100.

The ratio of the doping element concentration of the first doped conductive layer 120 to the doping element concentration of each of the multiple second portions 12 ranges from 1:100 to 1:2.

In some embodiments, the first doped conductive layer 120 and the second doped conductive layer 130 both have P-type doping elements, and the doping element concentration of the first doped conductive layer 120 ranges from $1\times10^{18}$ atom/cm$^3$ to $4.5\times10^{19}$ atom/cm$^3$, for example, it may from $1\times10^{18}$ atom/cm$^3$ to $2\times10^{18}$ atom/cm$^3$, $2\times10^{18}$ atom/cm$^3$ to $5\times10^{18}$ atom/cm$^3$, $5\times10^{18}$ atom/cm$^3$ to $9\times10^{18}$ atom/cm$^3$, $9\times10^{18}$ atom/cm$^3$ to $1\times10^{19}$ atom/cm$^3$, $1\times10^{19}$ atom/cm$^3$ to $3\times10^{19}$ atom/cm$^3$ or $3\times10^{19}$ atom/cm$^3$ to $4.5\times10^{19}$ atom/cm$^3$. The doping element concentration of each of the second portions 12 ranges from $5\times10^{19}$ atom/cm$^3$ to $3\times10^{20}$ atom/cm$^3$, for example, it may from $5\times10^{19}$ atom/cm$^3$ to $9\times10^{19}$ atom/cm$^3$, $9\times10^{19}$ atom/cm$^3$ to $1\times10^{20}$ atom/cm$^3$, $1\times10^{20}$ atom/cm$^3$ to $2\times10^{20}$ atom/cm$^3$ or $2\times10^{20}$ atom/cm$^3$ to $3\times10^{20}$ atom/cm$^3$. The doping element concentration of each of the multiple portions 11 ranges from $5\times10^{18}$ atom/cm$^3$ to $5\times10^{19}$ atom/cm$^3$, for example, it may from $5\times10^{18}$ atom/cm$^3$ to $9\times10^{18}$ atom/cm$^3$, $9\times10^{18}$ atom/cm$^3$ to $1\times10^{19}$ atom/cm$^3$, $1\times10^{19}$ atom/cm$^3$ to $2\times10^{19}$ atom/cm$^3$ or $2\times10^{19}$ atom/cm$^3$ to $5\times10^{19}$ atom/cm$^3$. In response to the doping element being P-type doping elements, within the above range, the first doped conductive layer, the multiple first portions 11, and the multiple second portions 12 have desirable performance, which allows the first doped conductive layer 120, the multiple first portions 11, and the multiple second portions 12 to form energy band bending on the first surface 1, and achieves carrier transport. The first doped conductive layer 120, the multiple first portions 11, and the multiple second portions 12 all have desirable passivation performance. In some embodiments. P-type doping elements may be boron, aluminum, nitrogen, gallium, or indium.

In some embodiments, the first doped conductive layer 120 and the second doped conductive layer 130 both have N-type doping elements, and the doping element concentration of the first doped conductive layer 120 ranges from $5\times10^{19}$ atom/cm$^3$ to $5\times10^{20}$ atom/cm$^3$, for example, it may from $5\times10^{19}$ atom/cm$^3$ to $9\times10^{19}$ atom/cm$^3$, $9\times10^{19}$ atom/cm$^3$ to $1\times10^{20}$ atom/cm$^3$, $1\times10^{20}$ atom/cm$^3$ to $2\times10^{20}$ atom/cm$^3$, or $2\times10^{20}$ atom/cm$^3$ to $5\times10^{20}$ atom/cm$^3$. The doping element concentration of each of the first portions 11 ranges from $1\times10^{20}$ atom/cm$^3$ to $2\times10^{21}$ atom/cm$^3$, for example, it may from $1\times10^{20}$ atom/cm$^3$ to $2\times10^{20}$ atom/cm$^3$, $2\times10^{20}$ atom/cm$^3$ to $5\times10^{20}$ atom/cm$^3$, $5\times10^{20}$ atom/cm$^3$ to $9\times10^{20}$ atom/cm$^3$, $9\times10^{20}$ atom/cm$^3$ to $1\times10^{21}$ atom/cm$^3$ or $1\times10^{21}$ atom/cm$^3$ to $2\times10^{21}$ atom/cm$^3$. The doping element concentration of each of the multiple second portions 12 ranges from $2\times10^{20}$ atom/cm$^3$ to $5\times10^{21}$ atom/cm$^3$, for example, it may from $2\times10^{20}$ atom/cm$^3$ to $3\times10^{20}$ atom/cm$^3$, $3\times10^{20}$ atom/cm$^3$ to $5\times10^{20}$ atom/cm$^3$, $5\times10^{20}$ atom/cm$^3$ to $9\times10^{20}$ atom/cm$^3$, $9\times10^{20}$ atom/cm$^3$ to $1\times10^{21}$ atom/cm$^3$, $1\times10^{21}$ atom/cm$^3$ to $3\times10^{21}$ atom/cm$^3$ or $3\times10^{21}$ atom/cm$^3$ to $5\times10^{21}$ atom/cm$^3$. In response to the doping elements being P-type doping elements, within the above range, the first doped conductive layer, the multiple first portions 11, and the multiple second portions 12 have desirable performance, which allows the first doped conductive layer 120, the multiple first portions 11, and the multiple second portions 12 to form energy band bending on the first surface 1, and achieves carrier transport. The first doped conductive layer 120, the multiple first portions 11, and the multiple second portions 12 all have desirable passivation performance. In some embodiments, N-type doping elements may be phosphorus, bismuth, antimony, or arsenic.

According to different types of doping elements, a doping element concentration range is designed for the first doped conductive layer 120, the multiple first portions 11, and the multiple second portions 12, so that within the above range, the doping element concentration of the first doped conductive layer 120 is smaller than that of the second doped conductive layer 130, which can reduce the probability of doping elements in the first doped conductive layer 120 transmitting to the tunneling layer 110, ensure that the tunneling layer 110 has desirable tunneling performance. And within the above range, the doping element concentration of the first doped conductive layer 120 is not too small, which ensures that the doping element concentration of the first doped conductive layer 120 is high enough to form a high potential barrier with the substrate 100, to allow carriers to pass through the tunneling layer 110 to the first doped conductive layer 120.

In addition, within the above range, the doping element concentration difference between the first doped conductive layer 120 and the multiple first portions 11, as well as between the first doped conductive layer 120 and the multiple second portions 12, are large enough to form concentration gradients between the first doped conductive layer 120 and the multiple first portions 11, as well as between the first doped conductive layer 120 and the multiple second portions 12, respectively. The doping element concentration of the first portion 11 is greater than that of the first doped conductive layer 120, so that the multiple first portions 11 can form a surface field on the surface of the first doped conductive layer 120, and the second portion 12 can form a surface field on the surface of the first doped conductive layer 120, which can enhance the transport of carriers in the first doped conductive layer 120 to the multiple first portions 11 and the multiple second portions 12.

Figure 4:
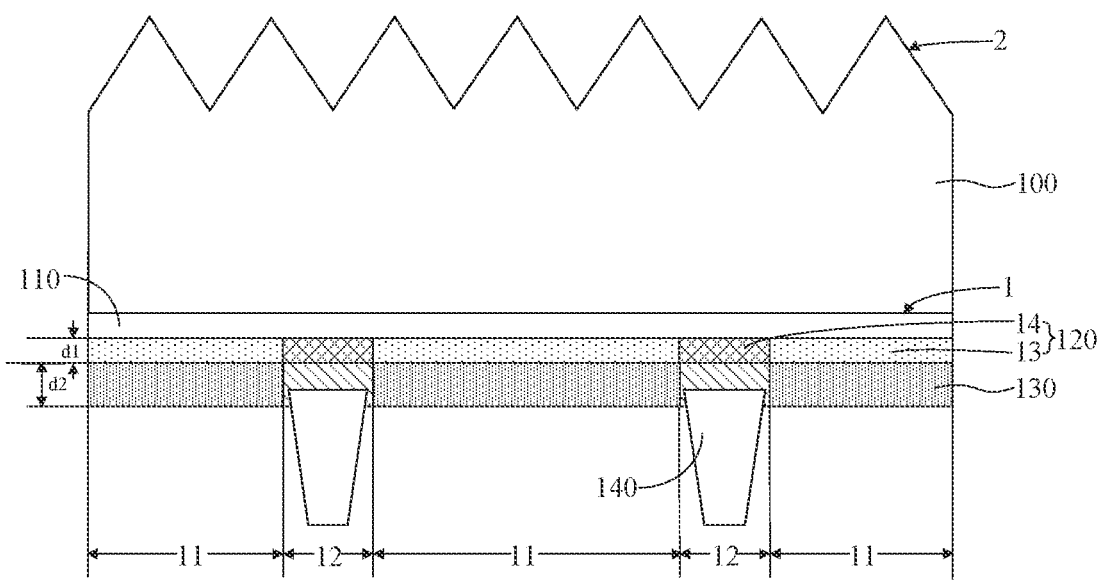
FIG. 4 is a cross-sectional view of a second solar cell provided according to an embodiment of the present application.

Referring to FIG. 4, FIG. 4 is a cross-sectional view of a second solar cell provided according to an embodiment of the present application, and FIG. 4 is a cross-sectional view of the solar cell shown in FIG. 2 along the AA' direction. In some embodiments, the first doped conductive layer 120 includes: multiple third portions and multiple fourth portions, each of the multiple third portions 13 and each of the multiple fourth portions 14 are alternately arranged in a direction perpendicular to a predetermined direction X and perpendicular to a thickness direction of the first doped conductive layer 120. Each of the multiple third portions 13 and each of the multiple fourth portions 14 extend in the predetermined direction X, and the predetermined direction X is any direction parallel to the first surface. Each of the multiple third portions 13 is disposed directly opposite to a corresponding one of the multiple first portions 11, each of the multiple fourth portions 14 is disposed directly opposite to a corresponding one of the multiple second portions 12. A doping element concentration of each of the multiple third portions 13 is lower than a doping element concentration of each of the multiple fourth portions 14. That is to say, the doping element concentration of one part of the first doped conductive layer 120 directly opposite the first electrode 140 is greater than that of the other part of the first doped conductive layer 120 that is not directly opposite the first electrode 140.

The doping element concentration of each of the multiple third portions 13 is lower than that in each of the multiple fourth portions 14, resulting in a concentration gradient between the multiple third portions 13 and the multiple fourth portions 14. The existence of this concentration gradient creates a built-in electric field in the first doped conductive layer 120 that points from the fourth portion 14 to the third portion 13, which can enhance the lateral transmission of carriers from the third portion 13 to the fourth portion 14. Since the fourth portion 14 is directly opposite the first electrode 140, compared to the third portion 13, the carriers transmitted from the fourth portion 14 to the second portion 12 have higher transmission efficiency, thus allowing more carriers to be collected by the first electrode 140. Based on this, the lateral transmission of carriers from the third portion 13 to the fourth portion 14 is enhanced, to improve the collection efficiency of carriers from the first electrode 140.

In some embodiments, in response to the first doped conductive layer 120 having P-type doping elements, the ratio of the doping element concentration of each of the multiple third portions 13 to the doping element concentration of each of the multiple fourth portions 14 ranges from 1:100 to 2:3, for example, it may from 1:90, 1:80, 1:70, 1:65, 1:55, 1:50, 1:40, 1:30, 1:25, 1:20, 1:18, 1:15, 1:10, 1:5, 1:3 or 2:3. In some embodiments, in response to the first doped conductive layer 120 having N-type doping elements, the ratio of the doping element concentration of each of the multiple third portions 13 to the doping element concentration of each of the multiple fourth portions 14 ranges from 1:30 to 5:6, for example, it may from 1:30 to 1:25, 1:25 to 1:20, 1:20 to 1:15, 1:15 to 1:10, 1:10 to 1:8, 1:8 to 1:5, 1:5 to 1:3, 1:3 to 2:3, or 2:3 to 5:6.

According to different types of doping elements, the doping element concentration of each of the multiple third portions 13 and the doping element concentration of each of the multiple fourth portions 14 are set to have different ratios, so that whether the multiple third portion 13 and the multiple fourth portion 14 are P-type or N-type doped, they both have desirable passivation performance on the first surface 1. And within the above ratio range, a concentration gradient can be formed between the multiple third portions 13 and the multiple fourth portions 14, thereby improving the collection efficiency of the first electrode 140 for carriers. In some embodiments, P-type doping elements may be boron, aluminum, nitrogen, gallium, or indium. In some embodiments, N-type doping elements may be phosphorus, bismuth, antimony, or arsenic.

In some embodiments, the first doped conductive layer 120 has P-type doping elements, there are multiple third portions 13 and multiple fourth portions 14. The ratio of the doping element concentration of each of the multiple third portions 13 in the multiple third portions 13 and the doping element concentration of each of the multiple fourth portions 14 in the multiple fourth portions 14 ranges from 1:100 to 2:3. In some embodiments, the first doped conductive layer 120 has N-type doping elements, there are multiple third portions 13 and multiple fourth portions 14. The ratio of the doping element concentration of each of the multiple third portions 13 in the multiple third portions 13 and the doping element concentration of each of the multiple fourth portions 14 in the multiple fourth portions 14 ranges from 1:30 to 5:6.

It is worth noting that the doping element concentration of each of the multiple third portions 13 and the doping element concentration of each of the multiple fourth portions 14 referred to here is a surface doping concentration of a surface of each of the multiple third portions 13 away from the substrate 100, and a surface doping concentration of a surface of each of the multiple fourth portions 14 away from the substrate 100, respectively.

In some embodiments, the first doped conductive layer 120 has P-type doping elements. The doping element concentration of each of the third portions 13 ranges from $1\times10^{18}$ atom/cm$^3$ to $5\times10^{19}$ atom/cm$^3$, for example, it may from $1\times10^{18}$ atom/cm$^3$ to $2\times10^{18}$ atom/cm$^3$, $2\times10^{18}$ atom/cm$^3$ to $5\times10^{18}$ atom/cm$^3$, $5\times10^{18}$ atom/cm$^3$ to $9\times10^{18}$ atom/cm$^3$, $9\times10^{18}$ atom/cm$^3$ to $1\times10^{19}$ atom/cm$^3$, $1\times10^{19}$ atom/cm$^3$ to $3\times10^{19}$ atom/cm$^3$ or $3\times10^{19}$ atom/cm$^3$ to $5\times10^{19}$ atom/cm$^3$. The doping element concentration of each of the multiple fourth portions 14 ranges from $1\times10^{19}$ atom/cm$^3$ to $1\times10^{20}$ atom/cm$^3$, for example, it may from $1\times10^{19}$ atom/cm$^3$ to $2\times10^{19}$ atom/cm$^3$, $2\times10^{19}$ atom/cm$^3$ to $5\times10^{19}$ atom/cm$^3$, $5\times10^{19}$ atom/cm$^3$ to $7\times10^{19}$ atom/cm$^3$, $7\times10^{19}$ atom/cm$^3$ to $9\times10^{19}$ atom/cm$^3$ or $9\times10^{19}$ atom/cm$^3$ to $1\times10^{20}$ atom/cm$^3$.

In some embodiments, the first doped conductive layer 120 has N-type doping elements. The doping element concentration of each of the third portions 13 ranges from $2\times10^{19}$ atom/cm$^3$ to $5\times10^{20}$ atom/cm$^3$, for example, it may from $2\times10^{19}$ atom/cm$^3$ to $3\times10^{19}$ atom/cm$^3$, $3\times10^{19}$ atom/cm$^3$ to $5\times10^{19}$ atom/cm$^3$, $5\times10^{19}$ atom/cm$^3$ to $9\times10^{19}$ atom/cm$^3$, $9\times10^{19}$ atom/cm$^3$ to $1\times10^{20}$ atom/cm$^3$, $1\times10^{20}$ atom/cm$^3$ to $3\times10^{20}$ atom/cm$^3$ or $3\times10^{20}$ atom/cm$^3$ to $5\times10^{20}$ atom/cm$^3$. The doping element concentration of each of the multiple fourth portions 14 ranges from $5\times10^{19}$ atom/cm$^3$ to $6\times10^{20}$ atom/cm$^3$, for example, it may from $5\times10^{19}$ atom/cm$^3$ to $7\times10^{19}$ atom/cm$^3$, $7\times10^{19}$ atom/cm$^3$ to $9\times10^{19}$ atom/cm$^3$, $9\times10^{19}$ atom/cm$^3$ to $1\times10^{20}$ atom/cm$^3$, $1\times10^{20}$ atom/cm$^3$ to $3\times10^{20}$ atom/cm$^3$, $3\times10^{20}$ atom/cm$^3$ to $5\times10^{20}$ atom/cm$^3$ or $5\times10^{19}$ atom/cm$^3$ to $6\times10^{20}$ atom/cm$^3$.

Within the above range, on the one hand, it is ensured that the doping element concentration of each of the multiple fourth portions 14 is greater than that in each of the multiple third portions 13, which enhances the lateral transport of carriers from the multiple third portions 13 to the multiple fourth portions 14. On the other hand, within the above range, the doping element concentration of each of the multiple third portions 13 and the doping element concentration of each of the multiple fourth portions 14 are not excessive, which ensures that the overall doping element concentration of the first doped conductive layer 120 is small, to reduce the probability of doping elements in the first doped conductive layer 120 transmitting to the tunneling layer 110.

In some embodiments, the ratio of the doping element concentration of each of the multiple fourth portions 14 to the doping element concentration of each of the multiple second portions 12 ranges from 1:10 to 5:6, for example, it may from 1:10 to 1:8, 1:8 to 1:6, 1:6 to 1:4, 1:4 to 1:3, 1:3 to 1:2, 1:2 to 2:3, 2:3 to 3:4, or 3:4 to 5:6. Within this range, the doping element concentration of each of the multiple fourth portions 14 is lower than that of each of the multiple second portions 12, which allows for the formation of a concentration gradient between the fourth portion 14 and the second portion 12, enhances the transport of carriers from the multiple fourth portions 14 to the multiple second portions 12, and thereby enhancing the collection ability of the first electrode 140 for carriers from the multiple second portions 12.

There are multiple fourth portions 14, and there are multiple second portions 12. The ratio of the doping element concentration of each of the multiple fourth portions 14 in the multiple fourth portions 14 to the doping element concentration of each of the multiple second portions 12 in the multiple second portions 12 ranges from 1:10 to 5:6.

In some embodiments, a thickness ratio of the first doped conductive layer 120 to the second doped conductive layer 130 is also controlled, which ensures that the first electrode 140 is difficult to penetrate the second doped conductive layer 130, while ensuring that the overall thickness of the first doped conductive layer 120 and the second doped conductive layer 130 is not excessive, so that the problem of excessive stress on the tunneling layer 110 caused by the overall thickness of the first doped conductive layer 120 and the second doped conductive layer 130 is avoided, and the desirable performance of the tunneling layer 110 is ensured.

In some embodiments, a ratio of the thickness d1 of the first doped conductive layer 120 to the thickness d2 of the second doped conductive layer 130 ranges from 2:1 to 1:12, for example, it may from 2:1 to 3:2, 3:2 to 4:3, 4:3 to 1:1, 1:1 to 1:3, 1:3 to 1:2, 1:2 to 1:5, 1:5 to 1:7, 1:7 to 1:9, or 1:9 to 1:12. Within the above range, it is difficult for the actually prepared first electrode 140 to penetrate the second doped conductive layer 130 to be in electrical contact with the first doped conductive layer 120, so that a desirable ohmic contact between the first electrode 140 and the second portion 12 is achieved. And the thickness d1 of the first doped conductive layer 120 should not be too large, which ensures that the overall thickness of the first doped conductive layer 120 and the second doped conductive layer 130 is not too large, to avoid excessive stress on the tunneling layer 110 caused by the overall thickness of the first doped conductive layer 120 and the second doped conductive layer 130.

In some embodiments, the material of the first doped conductive layer 120 includes at least one of amorphous silicon, polycrystalline silicon, or silicon carbide. In some embodiments, the first doped conductive layer 120 includes the third portion 13 and the fourth portion 14. The third portion 13 and the fourth portion 14 are obtained by doping different parts of the first doped conductive layer 120 with different doping element concentrations. Therefore, the third portion 13 and the fourth portion 14 is integrally formed.

In some embodiments, the material of the second doped conductive layer 130 includes at least one of amorphous silicon, polycrystalline silicon, or silicon carbide. The first portion 11 and the second portion 12 are obtained by doping different parts of the second doped conductive layer 130 with different concentrations. The first portion 11 and the second portion 12 is integrally formed.

In some embodiments, the first doped conductive layer 120 is composed of a first polycrystalline silicon, each of the multiple first portions 11 is composed of a second polycrystalline silicon, and each of the multiple second portions 12 is composed of a third polycrystalline silicon. The average grain size of the first polycrystalline silicon is greater than the average grain size of the second polycrystalline silicon, and is greater than the average grain size of the third polycrystalline silicon. The average grain size of the second polycrystalline silicon is greater than that of the third polycrystalline silicon.

In polycrystalline silicon, silicon atoms are arranged in the form of diamond lattice into many crystal nuclei, which grow into grains with different crystal orientations. These grains are combined to form polycrystalline silicon. That is to say, the first polycrystalline silicon, the second polycrystalline silicon, and the third polycrystalline silicon are all formed by combining multiple grains. The contact interface between different grains with the same structure but different orientations in the first polycrystalline silicon, the second polycrystalline silicon, and the third polycrystalline silicon is referred to as grain boundary.

Within a unit volume, the grain density of the first polycrystalline silicon in the first doped conductive layer 120 is lower than that of the second polycrystalline silicon in the second doped conductive layer 130 and the grain density of the third polycrystalline silicon. Therefore, the number of grain boundaries in the first doped conductive layer 120 per unit volume is smaller than the number of grain boundaries in the second doped conductive layer 130 per unit volume. Grain boundaries can serve as diffusion channels for doping elements. The more grain boundaries there are, the more diffusion of doping elements will occur, resulting in a higher concentration of doping elements. The number of grain boundaries within the first doped conductive layer 120 is relatively small, which results in a lower diffusion degree of doping elements within the first doped conductive layer 120 during the actual doping process to form the first doped conductive layer 120, thereby ensuring that the first doped conductive layer 120 has a lower concentration of doping elements. The number of grain boundaries in the second doped conductive layer 130 is relatively large, resulting in a higher diffusion of doping elements in the second doped conductive layer 130 and a higher concentration of doping elements in the second doped conductive layer 130.

In addition, within a unit volume, compared to the first doped conductive layer 120, the second doped conductive layer 130 has a larger number of grains, that is, a higher degree of crystallization of the second doped conductive layer 130. Therefore, the second doped conductive layer 130 has better passivation performance and can further improve the metal contact composite between the multiple second portions 12 and the first electrode 140.

Referring to FIG. 4, in some embodiments, the first doped conductive layer 120 includes multiple third portions 13 directly opposite to the multiple first portions 11 and multiple fourth portions 14 directly opposite to the multiple second portions 12. Each of the multiple third portions 13 is composed of a fourth polycrystalline silicon, and each of the multiple fourth portions 14 is composed of a fifth polycrystalline silicon. Each of the multiple first portions 11 is composed of the second polycrystalline silicon, and each of the multiple second portions 12 is composed of the third polycrystalline silicon. Among them, the average grain size of the fourth polysilicon is greater than that of the fifth polysilicon, the average grain size of the fifth polysilicon is greater than that of the third polysilicon, the average grain size of the second polysilicon is greater than that of the third polysilicon, and the average grain size of the fifth polysilicon is greater than that of the second polysilicon.

The average grain size of the fourth polycrystalline silicon is greater than that of the fifth polycrystalline silicon, that is, the average grain size within one part of the first doped conductive layer 120 directly opposite the first electrode 140 is smaller than the average grain size within the other part of the first doped conductive layer 120 that is not directly opposite the first electrode 140. Within a unit volume, the number of grain boundaries in the part of the first doped conductive layer 120 directly opposite the first electrode 140 is greater than the number of grain boundaries in the other part of the first doped conductive layer 120 that is not directly opposite the first electrode 140. In this way, in the actual doping process to form the first doped conductive layer 120, the diffusion degree of the doping elements in the part of the first doped conductive layer 120 directly opposite the first electrode 140 is greater than that in the other part of the first doped conductive layer 120 that is not directly opposite the first electrode 140, which is advantageous for achieving a doping element concentration of the third portion 13 less than that in the fourth portion 14, to create a concentration gradient between the multiple third portions 13 and the multiple fourth portions 14, which facilitates the lateral transport of carriers from the multiple third portions 13 to the multiple fourth portions 14.

It is worth noting that the average grain size of the first polycrystalline silicon, second polycrystalline silicon, third polycrystalline silicon, fourth polycrystalline silicon, and fifth polycrystalline silicon in the embodiments of the present application can be measured according to the national standard "GB/T 6394 to 2017 Method for Determining the Average Grain Size of Metals".

Figure 5:
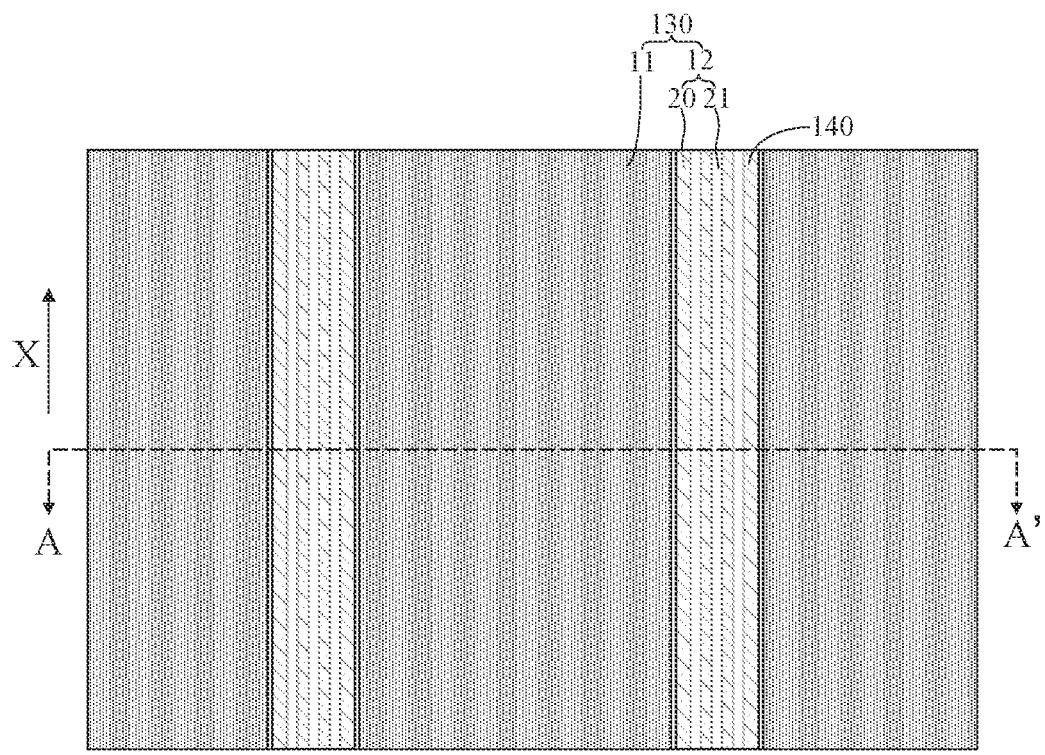
FIG. 5 is a top view of another solar cell provided according to an embodiment of the present application.
Figure 6:
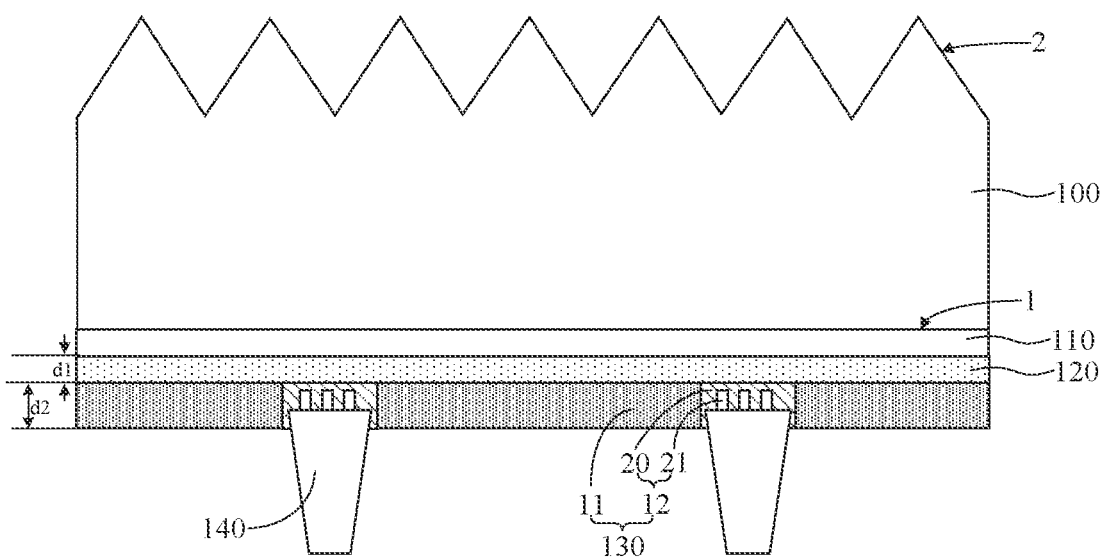
FIG. 6 is a cross-sectional view of a third solar cell provided according to an embodiment of the present application.

FIG. 5 is a top view structure of another solar cell provided according to an embodiment of the present application. FIG. 6 is a cross-sectional view of a third solar cell provided according to an embodiment of the present application, and FIG. 6 is a cross-sectional view of the solar cell shown in FIG. 5 along the AA' direction.

Referring to FIG. 5 and FIG. 6, in some embodiments, the substrate 100 has N-type doping elements, each of the multiple second portions 12 includes a main body portion 20 doped with N-type doping elements and a reverse doped portion 21 located in the main body portion 20 and doped with P-type doping elements.

In some embodiments, the material of the first electrode 140 is a metal, including any of copper, silver, nickel, or aluminum. The material of each of the second portions 12 includes silicon, such as any of polycrystalline silicon, amorphous silicon, or monocrystalline silicon. In the actual operation of preparing the first electrode 140, metal paste is first formed, and the metal in the metal paste reacts with oxygen to form metal ions. The metal ions move towards the second portion 12, and under the conditions of providing electrons, metal ions undergo a reduction reaction with the silicon in the second portion 12, to reduce the metal ions to metal. The formed metal is in the second portion 12, which causes the first electrode 140 to be in electrical contact with the second portion 12. However, in response to the amount of metal formed by reduction is too large, it may lead to the problem of the first electrode 140 penetrating the entire second portion 12, thereby causing damage to the second portion 12, and even causing contact between the first electrode 140 and the substrate 100, which has a negative impact on the photoelectric conversion performance of the solar cell.

The second doped conductive layer 130 includes a main body portion 20 with N-type doping elements and a reverse doped portion 21 located within the main body portion 20.

The reverse doped portion 21 is doped with P-type doping elements, which makes the holes in the reverse doped portion 21 dominant and provides more holes. And some of the electrons transmitted to the second portion 12 will recombine with holes, resulting in a decrease in the number of electrons compared to the case without the reverse doped portion 21. In this way, in the actual operation of forming the first electrode 140, due to the reduction of the number of electrons provided, the reaction degree between metal ions and silicon is weakened, which prevents the problem of excessive metal damage to the second portion 12 caused by the reduction of metal ions and silicon, and maintains the desirable photoelectric conversion performance of the solar cell.

In some embodiments, a volume proportion of the reverse doped portion 21 in the main body portion 20 is less than 50%. The reverse doped portion 21 occupies a minority in the main body portion 20, which makes the volume of the main body portion 20 large enough to form an energy band bending on the first surface 1, and the first electrode 140 can contact more of the main body portion 20 to form metal contact, which is conducive to ensuring the normal transmission of carriers in the multiple second portion 12 and the collection of carriers by the first electrode 140.

Figure 7:
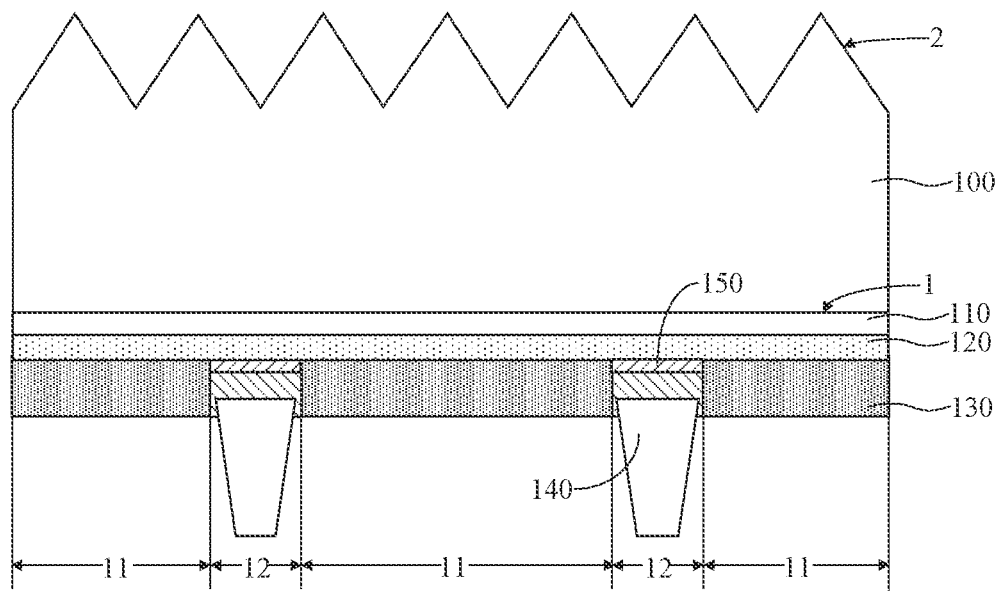
FIG. 7 is a cross-sectional view of a fourth solar cell provided according to an embodiment of the present application.
Figure 8:
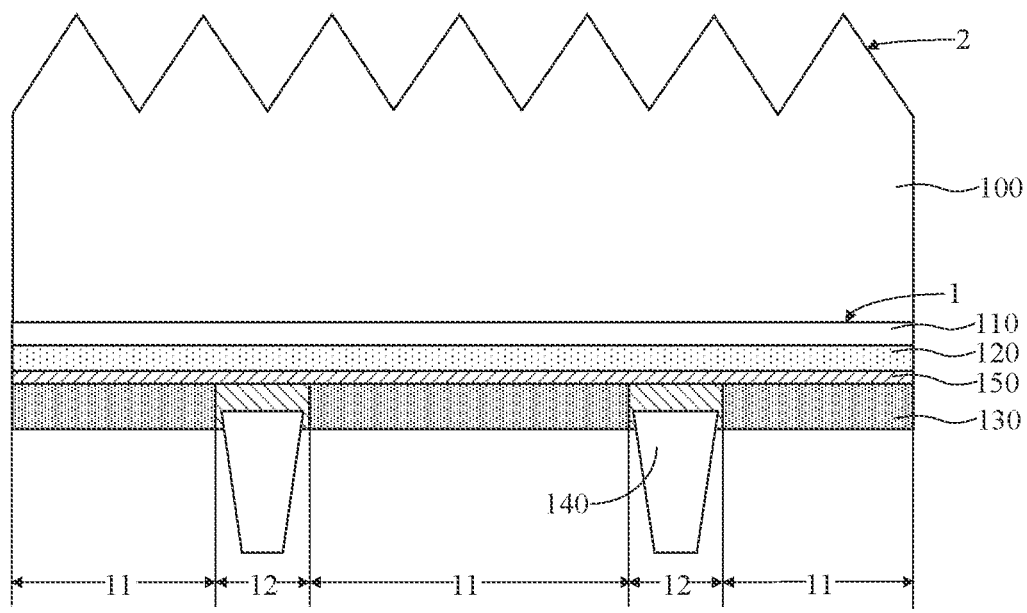
FIG. 8 is a cross-sectional view of a fifth solar cell provided according to an embodiment of the present application.

FIG. 7 is a cross-sectional view of a fourth solar cell provided according to an embodiment of the present application. FIG. 8 is a cross-sectional view of a fifth solar cell provided according to an embodiment of the present application. FIG. 7 and FIG. 8 are both cross-sectional view of the solar cell shown in FIG. 2 along the AA' direction.

Referring to FIG. 7 and FIG. 8, in some embodiments, the solar cell further includes a blocking layer 150 located between the first doped conductive layer 120 and the second doped conductive layer 130. A surface of the blocking layer 150 facing towards the substrate 100 is in contact with the surface of the first doped conductive layer 120 away from the substrate 100, and a surface of the blocking layer 150 away from the substrate 100 is in contact with the surface of the second doped conductive layer 130 facing towards the substrate 100. Due to the fact that the doping element concentration of the second doped conductive layer 130 is higher than that in the first doped conductive layer 120, in order to prevent a large amount of doping elements in the second doped conductive layer 130 from diffusing into the first doped conductive layer 120, a blocking layer 150 is set between the first doped conductive layer 120 and the second doped conductive layer 130 to prevent the diffusion of doping elements in the second doped conductive layer 130 to the first doped conductive layer 120, which maintains a low doping element concentration of the first doped conductive layer 120.

In addition, in some embodiments, the material of the first electrode 140 includes metal, and the substrate 100 is an N-type substrate 100. The blocking layer 150 can also block the transmission of electrons from the substrate 100 to the second portion 12, which reduces the degree to which metal ions in the metal paste used to form the first electrode 140 react with silicon under the conditions of providing electrons, and reduces the probability of the formed first electrode 140 penetrating the second doped conductive layer 130.

Referring to FIG. 7, in some embodiments, the blocking layer 150 is in contact with a surface of each of the multiple second portions 12 away from the substrate 100, and an orthographic projection of the blocking layer 150 on the first surface 1 completely overlaps with an orthographic projection of each of the multiple second portions 12 on the first surface 1. That is to say, the blocking layer 150 is only located between a part of the first doped conductive layer 120 and a part of the second doped conductive layer 130 directly opposite to the multiple second portions 12. Compared to the multiple first portions 11, the doping element concentration of each of the multiple second portions 12 is higher. Therefore, the blocking layer 150 is arranged only directly facing towards the multiple second portions 12, which prevent the doping elements in the second portion 12 with a higher doping element concentration from diffusing into the first doped conductive layer 120.

In some embodiments, there may be multiple blocking layers 150, and each of the multiple blocking layers 150 is in contact with a second portion 12 in the multiple second portions 12.

Referring to FIG. 8, in some embodiments, the blocking layer 150 is in contact with a surface of each of the multiple first portions 11 away from the substrate 100 and a surface of each of the multiple second portions 12 away from the substrate 100, and the orthographic projection of the blocking layer 150 on the first surface 1 completely overlaps with the orthographic projection of each first portion 11 on the first surface 1 and each second portion 12 on the first surface 1. That is to say, the blocking layer 150 covers the surface of the first doped conductive layer 120 away from the substrate 100 and the surface of the second doped conductive layer 130 towards the substrate 100, which enables the blocking layer 150 to block the doping elements in both the first portion 11 and the second portion 12, prevents the diffusion of the doping elements in the first portion 11 and the second portion 12 into the first doped conductive layer 120.

In some embodiments, regardless of whether the blocking layer 150 is only arranged opposite to the second portion 12 or arranged opposite to both the first portion 11 and the second portion 12, the material of the blocking layer 150 can be a wide band-gap material, which can effectively prevent the diffusion of doping elements in the second doped conductive layer 130 into the first doped conductive layer 120. In some embodiments, the material of the blocking layer 150 includes at least one of silicon oxide, silicon nitride, silicon oxynitride, silicon carbide or magnesium fluoride. By using the above materials, the blocking layer 150 can have a desirable blocking effect, and can also have a desirable passivation effect on the first surface 1, to suppress the carrier recombination of the first surface 1. In addition, the above materials have a relatively high hardness, which makes it difficult for the formed first electrode 140 to burn through the blocking layer 150 during the sintering process in the actual step of preparing the first electrode 140, thereby reducing the risk of contact between the formed first electrode 140 and the substrate 100.

In some embodiments, regardless of whether the blocking layer 150 is only arranged opposite to the second portion 12 or arranged opposite to both the first portion 11 and the second portion 12, the thickness of the blocking layer 150 ranges from 0.5 nm to 5 nm, for example, it may from 0.5 nm to 0.8 nm, 0.8 nm to 1 nm, 1 nm to 1.5 nm, 1.5 nm to 2 nm, 2 nm to 2.5 nm, 2.5 nm to 3 nm, 3 nm to 3.5 nm, 3.5 nm to 4 nm, 4 nm to 4.5 nm, or 4.5 nm to 5 nm. Within the above range, it can efficiently block the diffusion of doping elements in the second doped conductive layer 130 to the first doped conductive layer 120, without adversely affecting the overall performance of the passivation contact structure composed of the first doped conductive layer 120, the second doped conductive layer 130, and the tunneling layer 110, thereby ensuring the selective transmission of carriers by the passivation contact structure and a desirable passivation effect on the first surface 1.

Figure 9:
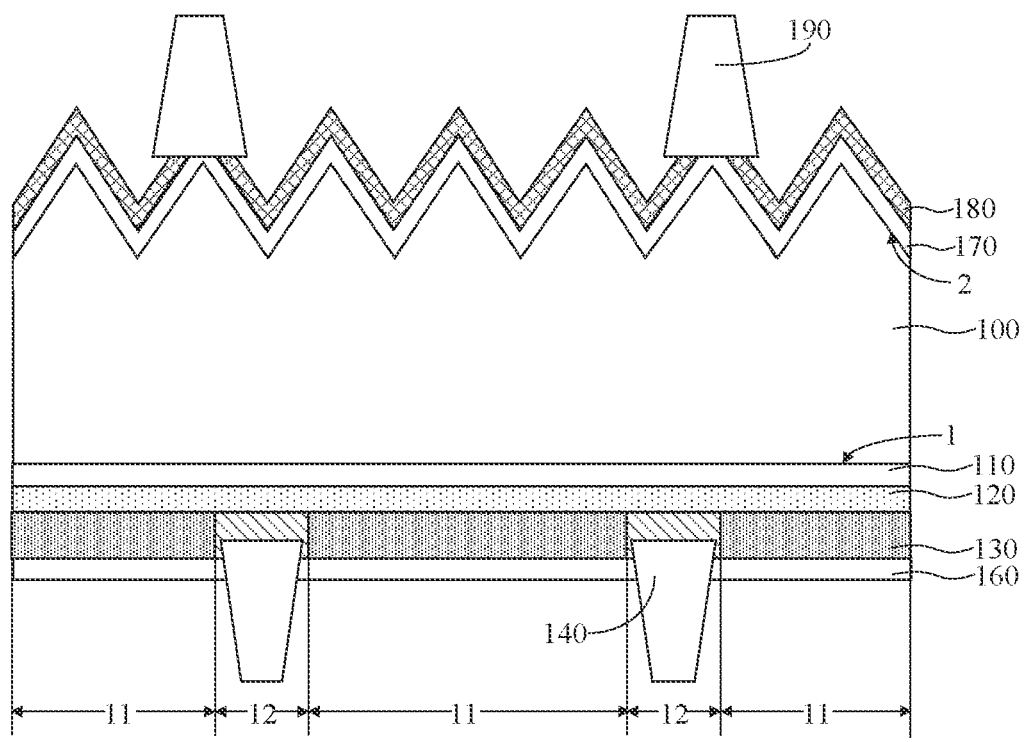
FIG. 9 is a cross-sectional view of a sixth solar cell provided according to an embodiment of the present application.

FIG. 9 is a cross-sectional view of a sixth solar cell provided according to an embodiment of the present application, and FIG. 9 is a cross-sectional view of the solar cell shown in FIG. 2 along the AA' direction.

Referring to FIG. 9, in some embodiments, the solar cell further includes a first passivation layer 160, which covers a surface of each of the multiple first portions 11 away from the substrate 100 and a surface of each of the multiple second portions 12 away from the substrate 100. The first electrode 140 penetrates the first passivation layer 160 to be in electrical contact with the multiple second portions 12. The first passivation layer 160 can have a desirable passivation effect on the first surface 1. The first passivation layer 160 can perform desirable chemical passivation on the hanging bonds of the first surface 1, reduce the defect state density of the first surface 1, and suppress the carrier recombination of the first surface 1.

In some embodiments, the first passivation layer 160 may be a single-layer structure. In some embodiments, the first passivation layer 160 may also be a multilayer structure. In some embodiments, the material of the first passivation layer 160 may be at least one of silicon oxide, aluminum oxide, silicon nitride or silicon oxynitride.

In some embodiments, the solar cell further includes an emitter 170 located on the second surface 2 of the substrate 100. The emitter 170 has opposite type of doping elements to that of substrate 100 to form a PN junction with substrate 100. In some embodiments, the material of the emitter 170 is the same as that of the substrate 100.

Figure 10:
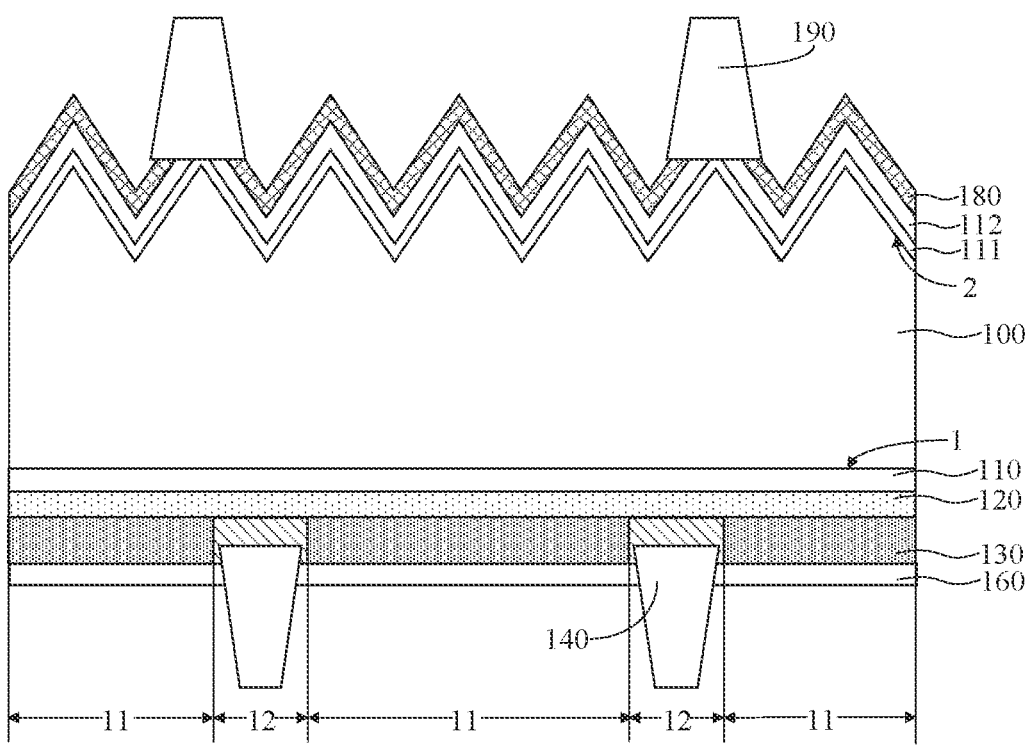
FIG. 10 is a cross-sectional view of a seventh solar cell provided according to an embodiment of the present application.
Figure 11:
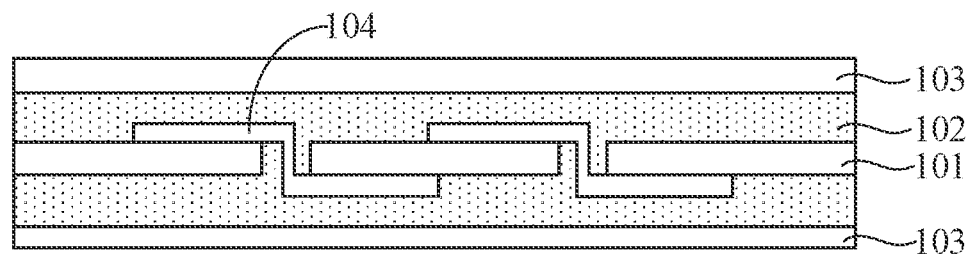
FIG. 11 is a cross-sectional view of a photovoltaic module provided according to another embodiment of the present application.

FIG. 10 is a cross-sectional view of a seventh solar cell provided according to an embodiment of the present application, and FIG. 10 is a cross-sectional view of the solar cell shown in FIG. 2 along the AA' direction.

Referring to FIG. 10, in some embodiments, the solar cell may not have an emitter 170, but with a second passivation contact structure on the second surface 2. The second passivation contact structure includes a second tunneling layer 111 and a third doped conductive layer 112 located on a surface of the second tunneling layer 111, which makes the solar cell to be a double-sided TOPCON cell. The third doped conductive layer 112 has opposite type of doping elements to that of the substrate 100, that is, the third doped conductive layer 112 has P-type doping elements to form a PN junction with the substrate 100.

In some embodiments, the material of the second tunneling layer 111 includes at least one of silicon oxide, silicon nitride, silicon oxynitride, silicon carbide or magnesium fluoride.

In some embodiments, the material of the third doped conductive layer 112 includes at least one of amorphous silicon, polycrystalline silicon, or silicon carbide.

Referring to FIG. 9 and FIG. 10, in some embodiments, the solar cell further includes a second passivation layer 180.

Referring to FIG. 9, in some embodiments, in response to there being an emitter 170 in the substrate 100, and the top surface of the emitter 170 coinciding with the second surface 2, the second passivation layer 180 is located on a surface of the emitter 170 away from the substrate 100.

Referring to FIG. 10, in some embodiments, in response to a second passivation contact structure being provided in the substrate 100 instead of an emitter 170, the second passivation layer 180 is located on the surface of the third doped conductive layer 112 away from the substrate 100. The second passivation layer 180 is configured to achieve a desirable passivation effect on the second surface 2 of the substrate 100, reduce the defect state density of the second surface 2, and effectively suppress the carrier recombination of the second surface 2 of the substrate 100. The second passivation layer 180 can also have a desirable anti reflection effect, which is conducive to reducing the reflection of incident light and improving the utilization of incident light.

In some embodiments, the second passivation layer 180 may be a single-layer structure, while in other embodiments, the second passivation layer 180 may also be a multilayer structure. In some embodiments, the material of the second passivation layer 180 may be at least one of silicon oxide, aluminum oxide, silicon nitride or silicon oxynitride.

Referring to FIG. 9 to FIG. 10, in some embodiments, the solar cell further includes a second electrode 190 located on the second surface 2 of the substrate 100.

Referring to FIG. 9, in some embodiments, in response to there being an emitter 170 in the substrate 100, the second electrode 190 penetrates the second passivation layer 180 to be in electrical contact with the emitter 170.

Referring to FIG. 10, in some embodiments, in response to a second passivation contact structure being provided in the substrate 100 instead of an emitter 170, the second electrode penetrates the second passivation layer 180 to be in electrical contact with the third doped conductive layer 112. In some embodiments, the material of the second electrode is metal, such as copper, silver, nickel, or aluminum.

A solar cell is provided according to the embodiments of the present application, in which the doping element concentration of the first doped conductive layer 120 is lower than that in the second doped conductive layer 130, to reduce the probability of doping elements in the first doped conductive layer 120 entering the tunneling layer 110. In addition, in the direction perpendicular to the first surface 1, the multiple first portions 11 and the multiple second portions 12 form a concentration gradient with the first doped conductive layer 120, which is conducive to driving the longitudinal transmission of carriers and enhancing the transmission of carriers in the substrate 100 to the second doped conductive layer 130. The doping element concentration of each of the multiple first portions 11 is lower than the doping element concentration of each of the multiple second portions 12. That is, a concentration gradient is formed between the multiple first portions 11 and the multiple second portions 12, which is conducive to enhancing the lateral transmission of carriers in the second doped conductive layer 130. Moreover, the doping element concentration of each of the multiple second portions 12 is relatively high, which can reduce the contact recombination loss of carriers between the first electrode 140 and the multiple second portions 12. The doping element concentration of each of the multiple first portions 11 is relatively small, which reduces the parasitic absorption of incident light by a part of the multiple first portion 11 that is not in contact with the first electrode 140.

Correspondingly, a photovoltaic module is further provided according to the embodiments of the present application, the photovoltaic module includes at least one cell string, where the at least one cell string is formed by connecting multiple solar cells 101 with each other, each of the multiple solar cells includes at least one solar cell according to any of above embodiments. The photovoltaic module further includes at least one encapsulation layer 102 configured to cover the at least one cell string, and at least one cover plate 103 configured to cover the at least one encapsulation layer 102. The solar cell 101 is electrically connected in whole or multiple pieces to form multiple cell strings, which are electrically connected in series and/or parallel.

Specifically, in some embodiments, multiple cell strings can be electrically connected through conductive strips 104. The at least one encapsulation layer 102 is configured to cover the first surface 1 and the second surface 2 of the substrate 100 of the solar cell 101. Specifically, the encapsulation layer 102 may be an organic packaging film such as ethylene vinyl acetate copolymer (EVA) film, polyethylene octene co elastomer (POE) film, polyethylene terephthalate (PET) film, or polyvinyl butyrate (PVB) film. In some embodiments, the at least one cover plate 103 may be a glass cover plate, a plastic cover plate, or other cover plates with transparent features. Specifically, a surface of the at least one cover plate 103 facing towards the at least one encapsulation layer 102 may be a surface with protrusions and recesses, thereby increasing the utilization of incident light.

Correspondingly, a method for preparing a solar cell is further provided according to the embodiments of the present application, the method can be used to prepare the solar cell provided according to the above embodiments, and the method includes the following operations.

Figure 12:
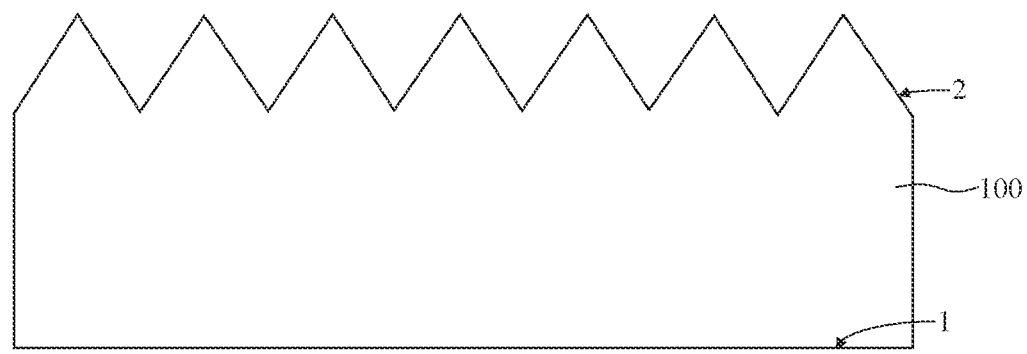
FIG. 12 is a cross-sectional view of a solar cell corresponding to an operation of providing a substrate in a method for preparing a solar cell provided according to an embodiment of the present application.

Referring to FIG. 12, a substrate 100 having a first surface 1 is provided.

The substrate 100 is configured to receive incident light and generate photo generated carriers, and has a second surface 2 opposite to the first surface 1.

In some embodiments, the substrate 100 is doped with N-type doping elements, such as phosphorus (P), bismuth (Bi), antimony (Sb), or arsenic (As) and other V to group elements. In some embodiments, the substrate is doped with P-type doping elements, such as boron (B), aluminum (Al), gallium (Ga), or gallium (In) and other group III elements.

In some embodiments, the second surface 2 of the substrate 100 may be a textured surface, such as a pyramid textured surface, to reduce the reflectivity of the second surface 2 of the substrate 100 to incident light, thereby increasing the absorption and utilization of light. The first surface 1 of substrate 100 may be a polished surface, that is, the first surface 1 of substrate 100 is relatively flat compared to the second surface 2 of substrate 100. In some embodiments, the second surface 2 of the substrate 100 and the first surface 1 of the substrate 100 are both pyramid textured surfaces.

In some embodiments, a first doping process is performed on the substrate 100, such as an ion implantation process to diffuse doping elements into the substrate 100.

In some embodiments, the formed solar cell is a TOPCON cell.

Figure 13:
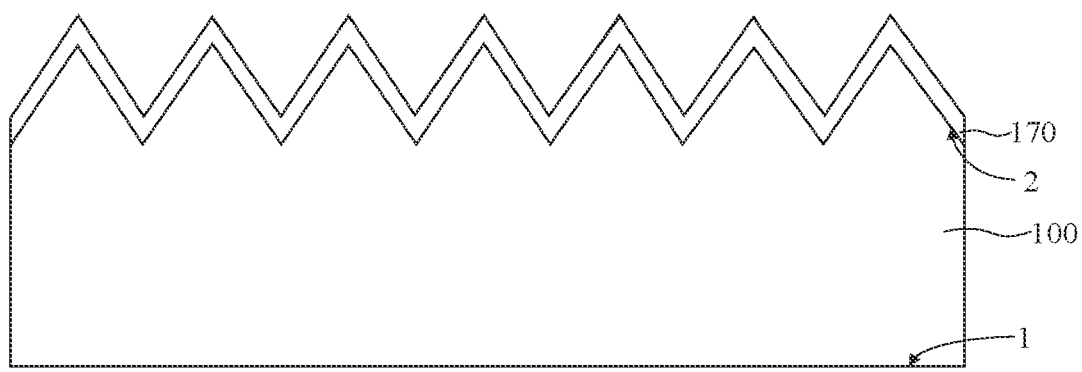
FIG. 13 is a cross-sectional view of a solar cell corresponding to an operation of forming an emitter in a method for preparing a solar cell provided according to an embodiment of the present application.

Referring to FIG. 13, in some embodiments, the method for preparing a solar cell includes: forming an emitter 170 in the substrate 100, exposing a top surface of the emitter 170, and the top surface of the emitter 170 completely overlaps with the second surface 2. The emitter 170 has opposite type of doping elements to that of substrate 100 to form a PN junction with substrate 100.

In some embodiments, an operation of forming an emitter 170 includes performing a diffusion process on a side of the second surface 2 of the substrate 100, and diffusing P-type doping elements from the second surface 2 of the substrate 100 to a part of the substrate 100, to convert the part of the substrate 100 diffused with P-type doping elements into the emitter 170. In some embodiments, the diffusion process may be an ion implantation process. In some embodiments, phosphorus diffusion treatment is performed on a side of the second surface 2 of the substrate 100.

Figure 14:
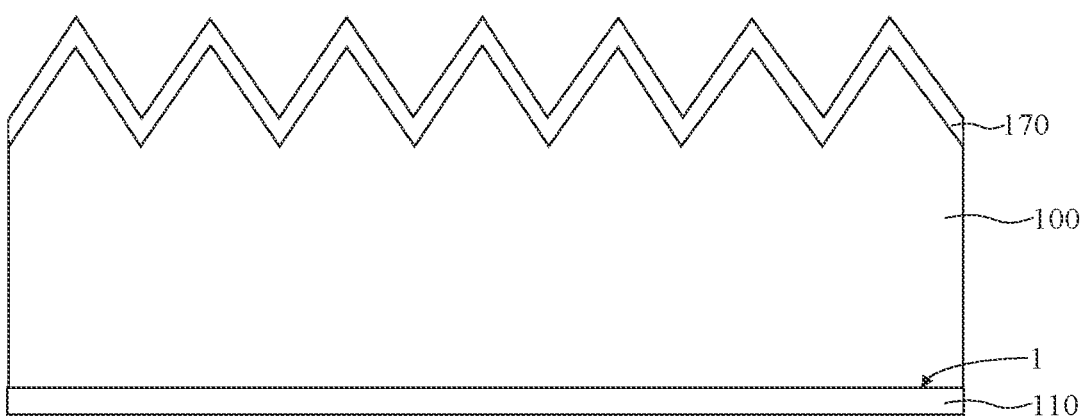
FIG. 14 is a cross-sectional view of a solar cell corresponding to an operation of forming a tunneling layer in a method for preparing a solar cell provided according to an embodiment of the present application.

Referring to FIG. 14, after the emitter 170 is formed, a tunneling layer 110 is formed on the first surface 1.

In some embodiments, the tunneling layer 110 is formed on the first surface 1 by a deposition process. The deposition process includes either atomic layer deposition or chemical vapor deposition.

In some embodiments, the material of the tunneling layer 110 includes at least one of silicon oxide, aluminum oxide, silicon nitride, silicon oxynitride, amorphous silicon or polycrystalline silicon.

Referring to FIG. 15 to FIG. 25, a first doped conductive layer 120 is formed on a surface of the tunneling layer 110 away from the substrate 100. A second doped conductive layer 130 is formed on a surface of the first doped conductive layer 120 away from the substrate 100. The second doped conductive layer 130 includes multiple first portions 11 and multiple second portions 12 arranged alternately in a direction perpendicular to a predetermined direction X and perpendicular to a thickness direction of the second doped conductive layer 130. Each of the multiple first portions 11 and the multiple second portions 12 extends along the predetermined direction X, a doping element concentration of the first doped conductive layer 120 is lower than a doping element concentration of each of the multiple first portions 11, and the doping element concentration of each of the multiple first portions 11 is lower than a doping element concentration of each of the multiple second portions 12.

The first doped conductive layer 120 is closer to the substrate 100 compared to the second doped conductive layer 130, and the doping element concentration of the first doped conductive layer 120 is lower than that of the second doped conductive layer 130, to reduce the probability of doping elements in the first doped conductive layer 120 entering the tunneling layer 110.

In some embodiments, an operation of forming the first doped conductive layer 120 and the second doped conductive layer 130 includes the following operations.

Referring to FIG. 15 to FIG. 19, an intrinsic silicon layer 30 is formed on the surface of the tunneling layer 110. In some embodiments, the intrinsic silicon layer 30 may be any of polycrystalline silicon, amorphous silicon, monocrystalline silicon, or silicon carbide. The first doping process is performed on the intrinsic silicon layer 30 to form an initial doped silicon layer 32, a second doping process is performed on the initial doped silicon layer 32, to enable doping elements to be only diffused into a part of the initial doped silicon layer 32, to form a doped silicon layer 33. The other part of the initial doped silicon layer 32 serves as the first doped conductive layer 120. Finally, a third doping process is performed on a part of the doped silicon layer 33 to form the second portion 12, and the other part of the doped silicon layer 33 serves as the first portion 11.

In some embodiments, the first doping process may be an ion implantation process. In some embodiments, the second doping process may be a laser doping process, in which the wavelength, frequency, energy, or scanning rate of the laser are controlled, to control the depth at which the doping elements reach the initial doped silicon layer 32, and thus controlling the thickness of the formed first doped conductive layer 120 and the formed doped silicon layer 33. In some embodiments, the third doping process may be a laser doping process, where only a part of the doped silicon layer 33 is subjected to laser irradiation treatment to inject doping elements again into the part of the doped silicon layer 33, to form the multiple second portions 12 and the multiple first portions 11.

Figure 15:
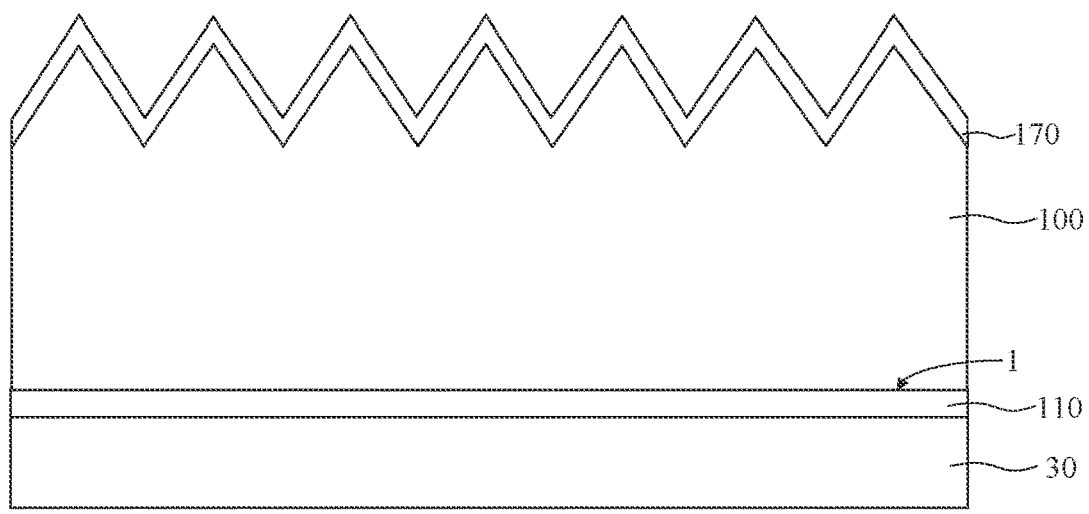
FIG. 15 is a cross-sectional view of a solar cell corresponding to an operation of forming an intrinsic silicon layer in a method for preparing a solar cell provided according to an embodiment of the present application.

Referring to FIG. 15, in some embodiments, the intrinsic silicon layer 30 is an intrinsic polycrystalline silicon layer. In the first doping process, a doping source is deposited on the surface of the intrinsic silicon layer 30, which includes the first doping element. In some embodiments, the first doping elements are N-type doping element. In some embodiments, the N-type doping source may be a single substance or compound containing pentavalent elements, such as phosphorus or a compound containing phosphorus, such as phosphorus trichloride.

Figure 16:
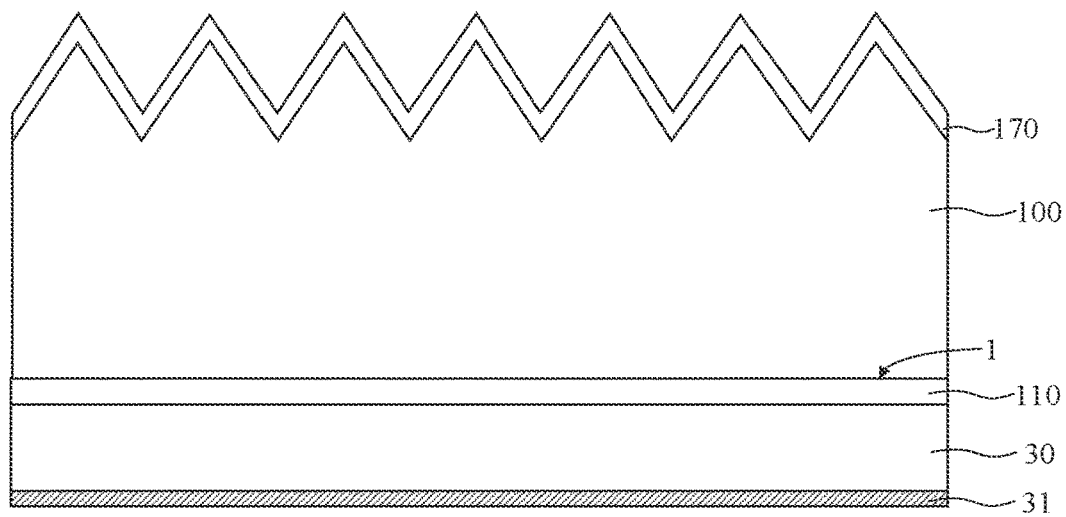
FIG. 16 is a cross-sectional view of a solar cell corresponding to an operation of forming a glass layer in a method for preparing a solar cell provided according to an embodiment of the present application.
Figure 17:
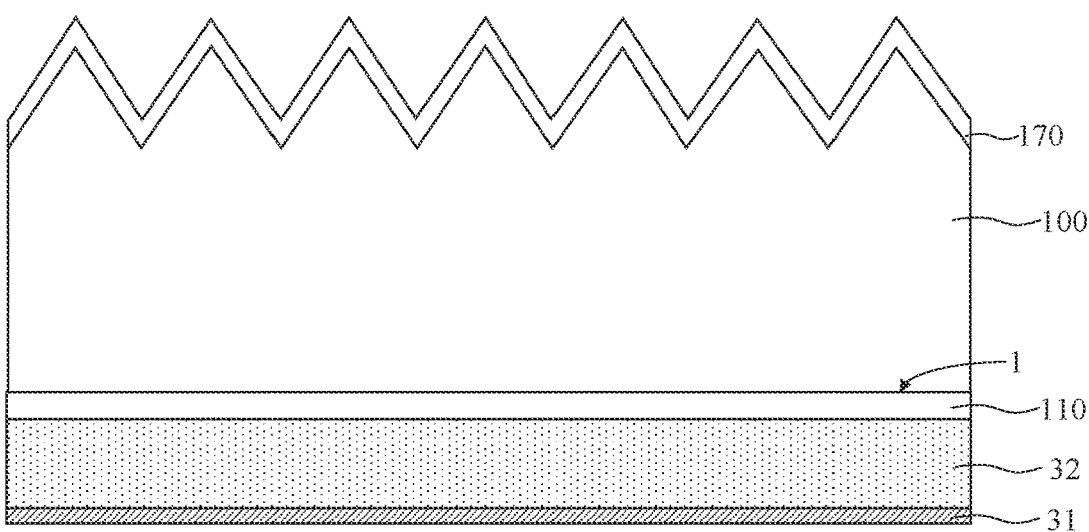
FIG. 17 is a cross-sectional view of a solar cell corresponding to an operation of forming an initial doped silicon layer in a method for preparing a solar cell provided according to an embodiment of the present application.

Before the operation of depositing a doping source, the substrate 100 is disposed into a quartz boat, and the quartz boat is placed into a diffusion furnace. After the substrate 100 is arranged inside the quartz boat, the substrate 100 is heated. A doping source is deposited on the first surface 1 of substrate 100 and oxygen is introduced. In some embodiments, the doping source is nitrogen carrying phosphorus trichloride. Referring to FIG. 16, in this operation, oxygen reacts with polycrystalline silicon, to convert a part of the intrinsic silicon layer 30 along the thickness direction into a glass layer 31, which is silicon oxide containing the first doping elements. For example, in response to the first doping elements is phosphorus, the glass layer 31 is phosphorus silicon glass, that is, silicon oxide containing phosphorus. Referring to FIG. 17, a large amount of first doping elements are stored in glass layer 31, which is then heated and pushed together in a nitrogen atmosphere to diffuse the first doping elements stored in glass layer 31 into the intrinsic polycrystalline silicon, to form the initial doped silicon layer 32.

Figure 18:
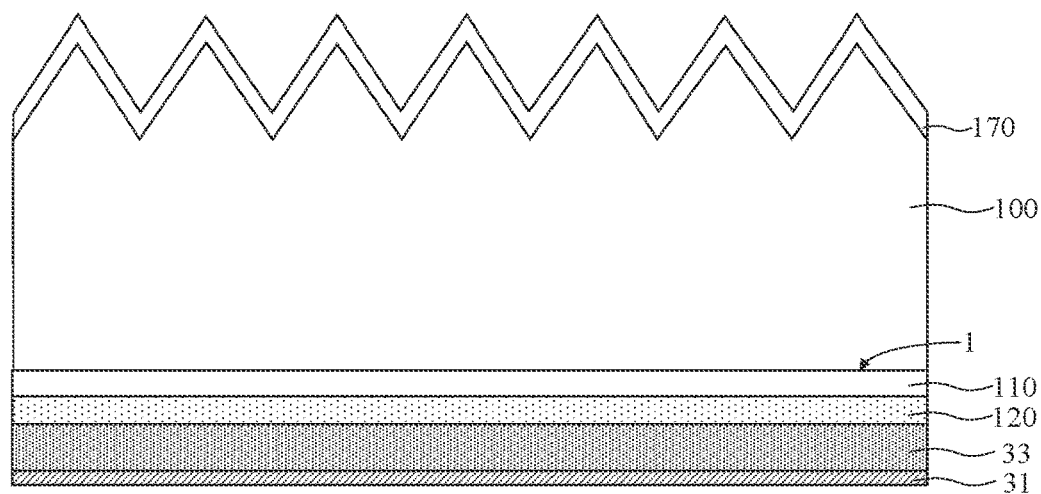
FIG. 18 is a cross-sectional view of a solar cell corresponding to an operation of forming a first doped conductive layer and a doped silicon layer in another method for preparing a solar cell provided according to an embodiment of the present application.

Referring to FIG. 18, in the second doping process, the glass layer 31 is retained and irradiated with laser. The first doping element in the laser treated glass layer 31 diffuses again into a part of the initial doped silicon layer 32, to form the first doped conductive layer 120 and the doped silicon layer 33.

Figure 19:
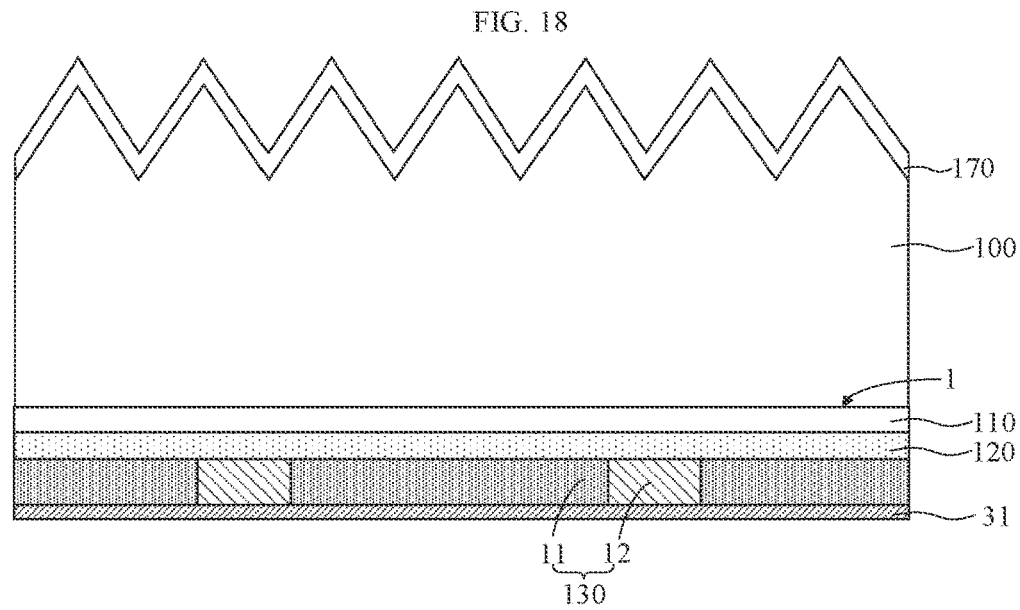
FIG. 19 is a cross-sectional view of a solar cell corresponding to an operation of forming multiple first portions and multiple second portions in a method for preparing a solar cell provided according to an embodiment of the present application.

Referring to FIG. 19, in the third doping process, the glass layer 31 is continued to be retained, and a part of the glass layer 31 is irradiated with laser. The first doping element in the laser treated glass layer 31 diffuses again into a part of the doped silicon layer 33, to form the multiple first portions 11 and the multiple second portions 12.

In some embodiments, the laser used in the laser process may be any of infrared laser, green laser, or ultraviolet laser. These lasers can be generated by any of a CO2 laser device, an excimer laser device, a Ti: sapphire laser device, a semiconductor laser device, a copper vapor laser device, or other laser devices that can emit lasers.

The laser emitted by the laser device irradiates the surface of glass layer 31, and under the thermal effect of the laser, the first doping element in the glass layer 31 diffuses to the initial doped silicon layer 32 or doped silicon layer 33.

After the multiple first portions 11 and the multiple second portions 12 are formed, the glass layer 31 is removed by an acid washing process.

Figure 21:
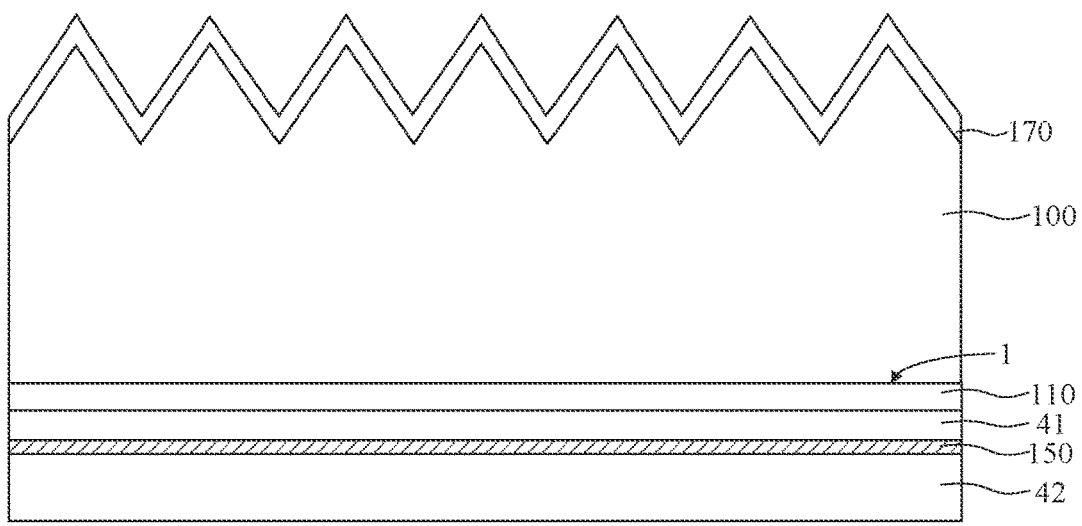
FIG. 21 is a cross-sectional view of a solar cell corresponding to an operation of forming a blocking layer and a second intrinsic silicon layer in another method for preparing a solar cell provided according to an embodiment of the present application.

Referring to FIG. 21, in some embodiments, before the operation of forming the second doped conductive layer 130, the method further includes: forming a blocking layer 150 located on a surface of the first doped conductive layer 120 away from the substrate 100. The material of the blocking layer 150 includes at least one of silicon oxide, silicon nitride, silicon oxynitride or silicon carbide. The blocking layer 150 plays a role in blocking the diffusion of doping elements in the second doped conductive layer 130 to the first doped conductive layer 120, and can maintain a small concentration of doping elements in the first doped conductive layer 120.

In some embodiments, an operation of forming the first doped conductive layer 120, the second doped conductive layer 130, and the blocking layer 150 includes the following operations.

Figure 20:
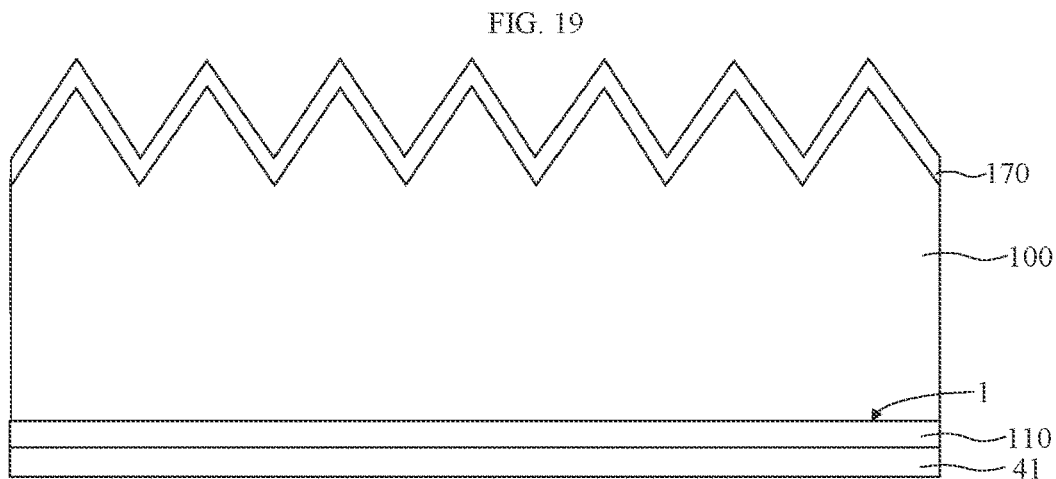
FIG. 20 is a cross-sectional view of a solar cell corresponding to an operation of forming a first intrinsic silicon layer in another method for preparing a solar cell provided according to an embodiment of the present application.

Referring to FIG. 20, a first intrinsic silicon layer 41 is formed on the surface of the tunneling layer 110. In some embodiments, the first intrinsic silicon layer 41 may be any of polycrystalline silicon, amorphous silicon, monocrystalline silicon, or silicon carbide. In some embodiments, the first intrinsic silicon layer 41 is formed on the surface of the tunneling layer 110 by a deposition process, such as the atomic layer deposition process.

Referring to FIG. 21, a blocking layer 150 is formed on a surface of the first intrinsic silicon layer 41. In some embodiments, a deposition process can be used to form the blocking layer 150, for example, an atomic layer deposition process or a chemical vapor deposition process can be used to form the blocking layer 150. In some embodiments, the blocking layer 150 can be formed entirely on the surface of the first intrinsic silicon layer 41, so that the blocking layer is arranged directly opposite to the multiple first portions 11 and multiple second portions 12 to be formed subsequently. In some embodiments, the blocking layer 150 may also be formed on a surface of a part of the first intrinsic silicon layer 41, so that the blocking layer is arranged directly opposite to multiple second portions 12 to be formed subsequently.

Reference is made continuously to FIG. 21, a second intrinsic silicon layer 42 is formed on a surface of the blocking layer 150. In some embodiments, the second intrinsic silicon layer 42 may be any of polycrystalline silicon, amorphous silicon, monocrystalline silicon, or silicon carbide. In some embodiments, the second intrinsic silicon layer 42 is formed on the surface of the tunneling layer 110 by a deposition process, such as the atomic layer deposition process.

A doping source is deposited on a surface of the second intrinsic silicon layer 42 away from the substrate 100, and the doping source includes first doping elements. While depositing the doping source, oxygen is introduced to convert a part of the second intrinsic silicon layer 42 into a glass layer 31 along the thickness direction of the second intrinsic silicon layer 42, and the glass layer 31 is a silicon oxide layer containing the first doping elements.

In some embodiments, the doping source is an N-type doping source with the first doping elements being N-type doping elements. In some embodiments, the N-type doping source is a single substance or compound containing pentavalent elements, such as phosphorus or a compound containing phosphorus, such as phosphorus trichloride.

Before the operation of depositing a doping source, the substrate 100 is disposed into a quartz boat, and the quartz boat is placed into a diffusion furnace. After the substrate 100 is arranged inside the quartz boat, the substrate 100 is heated up to a first preset temperature ranged from 500 degrees Celsius to degrees Celsius. After heating up to the first preset temperature, a doping source is deposited on the first surface 1 of substrate 100 and oxygen is introduced. The deposition time of the doping source is 50 s to 800 s. In some embodiments, the doping source may be nitrogen carrying phosphorus trichloride, where the concentration of phosphorus trichloride ranges from 0.1% to 3 wt %, and the nitrogen flow rate ranges from 2000 sccm to 4000 sccm.

Figure 22:
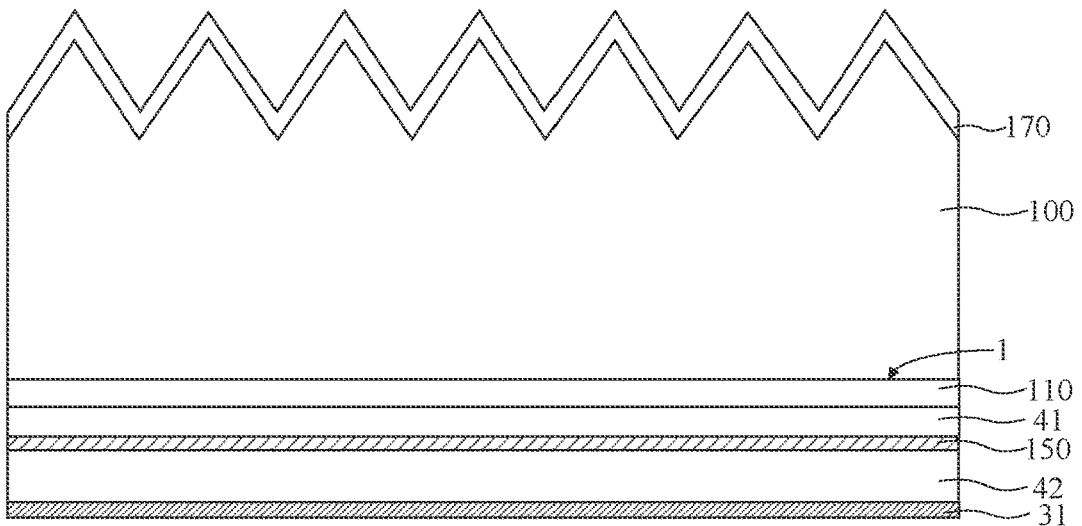
FIG. 22 is a cross-sectional view of a solar cell corresponding to an operation of forming a glass layer in another method for preparing a solar cell provided according to an embodiment of the present application.

Referring to FIG. 22, in the above operations, oxygen reacts with silicon to convert a part of the second intrinsic silicon layer 42 into a glass layer 31 along the thickness direction of the second intrinsic silicon layer. The glass layer 31 is a silicon oxide layer containing the first doping elements. For example, in response to the first doping elements being phosphorus, the glass layer 31 is a phosphorus silicon glass, that is, silicon oxide containing phosphorus, and there is a large amount of the first doping elements stored in the glass layer 31.

Figure 23:
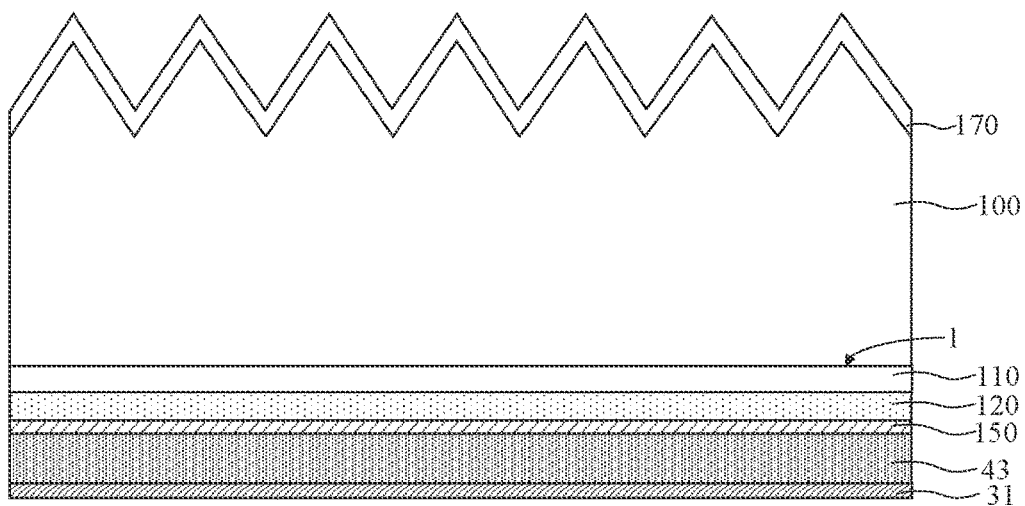
FIG. 23 is a cross-sectional view of a solar cell corresponding to an operation of forming a first doped conductive layer and an initial second doped conductive layer in another method for preparing a solar cell provided according to an embodiment of the present application.

Referring to FIG. 23, a first doping process is performed, where the first doping process includes diffusing a part of the first doping elements stored in the glass layer into the first intrinsic silicon layer 41 to form the first doped conductive layer 120, and diffusing another part of the first doping elements into the second intrinsic silicon layer 42 other than the glass layer 31 to form an initial second doped conductive layer 43. In some embodiments, after heating up to the second preset temperature, the first doping process is performed, where the second preset temperature is greater than the first preset temperature, for example, 900 degrees Celsius to 1200 degrees Celsius. Simultaneously, the first doping elements stored in the glass layer 31 is diffused into the first intrinsic silicon layer 41 under nitrogen atmosphere, to form the first doped conductive layer 120.

It can be understood that due to the presence of the blocking layer 150, during the diffusion of the first doping elements in the glass layer 31 from the second intrinsic silicon layer 42 to the first intrinsic silicon layer 41, the blocking layer 150 acts as a barrier to the first doping elements, resulting in a smaller number of doping elements diffusing into the first intrinsic silicon layer 41 than into the second intrinsic silicon layer 42. Therefore, the doping element concentration of the first doped conductive layer 120 formed is smaller than the doping element concentration of the initial second doped conductive layer 43.

Figure 24:
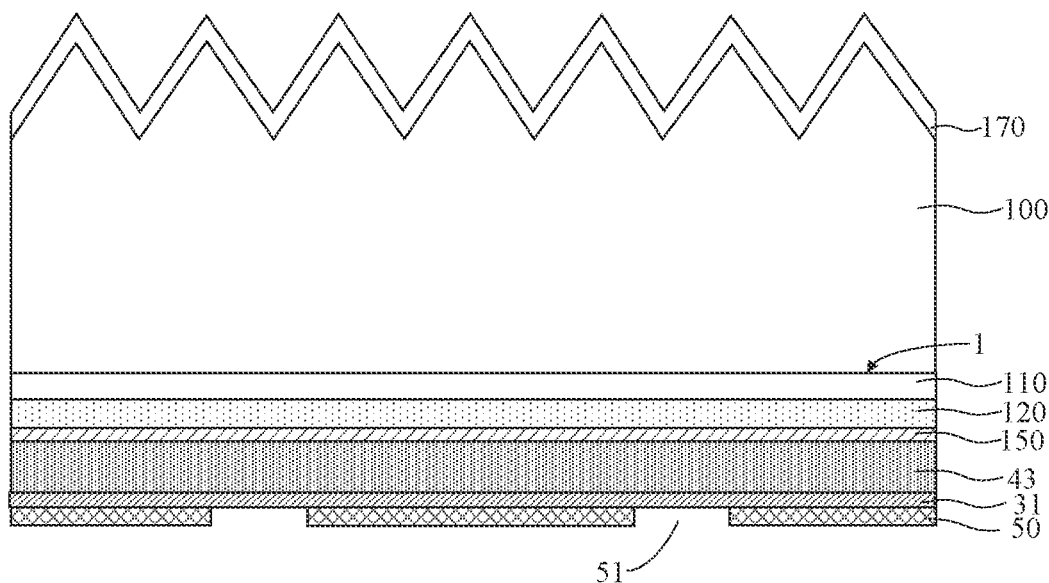
FIG. 24 is a cross-sectional view of a solar cell corresponding to an operation of forming a mask layer in another method for preparing a solar cell provided according to an embodiment of the present application.
Figure 25:
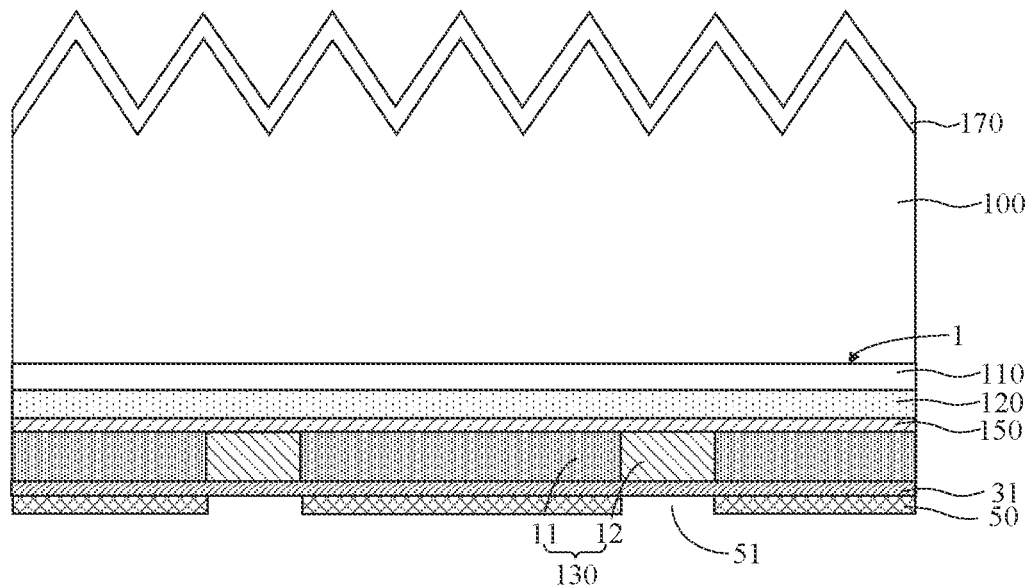
FIG. 25 is a cross-sectional view of a solar cell corresponding to an operation of forming multiple first portions and multiple second portions in another method for preparing a solar cell provided according to an embodiment of the present application.

Referring to FIG. 24 to FIG. 25, a second doping process is performed on a part of the glass layer 31, where the second doping process includes diffusing remaining first doping elements stored in the glass layer 31 into the initial second doped conductive layer 43 in a direction perpendicular to the first surface to convert one part of the initial second doped conductive layer 43 into the multiple second portions 12 of the second doped conductive layer 130, and convert the other part of the initial second doped conductive layer 43 into the multiple first portions 11 of the second doped conductive layer 130.

Referring to FIG. 24, in some embodiments, a mask layer 50 is formed on the surface of the glass layer 31 before the second doping process. The mask layer 50 has a first opening 51, and the first opening 51 exposes a part of the surface of the glass layer 31. In some embodiments, the mask layer 50 is photolithographed to form the first opening 51.

In some embodiments, the material of the mask layer 50 is either silicon oxide or silicon oxynitride, and the mask layer 50 is formed by a deposition process.

Referring to FIG. 25, in some embodiments, the second doping process is performed along the first opening 51 on the initial second doped conductive layer 43 (referring to FIG. 24), the first doping elements in a part of the glass layer 31 directly opposite to the first opening 51 are diffused into the initial second doped conductive layer 43 to form multiple second portions 12 with a high doping element concentration. The other part of the initial second doped conductive layer 43 is masked by the mask layer 50. Therefore, the doping elements in the glass layer 31 hardly diffuse into the other part of the initial second doped conductive layer 43, resulting in the remaining initial second doped conductive layer 43 forming the multiple first portions 11 with a lower doping element concentration.

It is not difficult to find that due to the doping element concentration of the initial second doped conductive layer 43 being greater than the doping element concentration of the first doped conductive layer 120, the doping element concentration of each of the multiple first portions 11 and the doping element concentration of each of the multiple second portions 12 are both greater than the doping element concentration of the second doped conductive layer 130.

In some embodiments, the second doping process includes a laser process, and the laser process has a laser wavelength ranged from 300 nm to 532 nm, for example, it may from 300 nm to 330 nm, 330 nm to 350 nm, 350 nm to 380 nm, 380 nm to 420 nm, 420 nm to 480 nm, or 480 nm to 532 nm. The laser frequency ranges from 120 kHz to 1500 kHz, for example, it may from 120 kHz to 180 KHz, 180 KHz to 240 kHz, 240 KHz to 330 kHz, 330 kHz to 480 kHz, 480 KHz to 600 kHz, 600 kHz to 700 kHz, 700 kHz to 800 kHz, 800 kHz to 900 kHz, 900 kHz to 1050 kHz, or 1050 kHz to 1200 kHz. The scanning speed ranges from 1000 mm/s to 40000 mm/s, such as 1000 mm/s to 2000 mm/s, 2000 mm/s to 5000 mm/s, 5000 mm/s to 6000 mm/s, 6000 mm/s to 7500 mm/s, 7500 mm/s to 9000 mm/s, 9000 mm/s to 12000 mm/s, 12000 mm/s to 18000 mm/s, 18000 mm/s to 25000 mm/s, 25000 mm/s to 28000 mm/s, 28000 mm/s to 32000 mm/s, 32000 mm/s to 34000 mm/s to 36000 mm/s, 36000 mm/s to 38500 mm/s to 40000 mm/s, or 38500 mm/s to 40000 mm/s. The laser energy ranges from 0.1 $J/cm^2$ to 1.5 $J/cm^2$, for example, it may from 0.1 $J/cm^2$ to 0.3 $J/cm^2$, 0.3 $J/cm^2$ to 0.5 $J/cm^2$, 0.5 $J/cm^2$ to 0.8 $J/cm^2$, 0.8 $J/cm^2$ to 1 $J/cm^2$, 1 $J/cm^2$ to 1.2 $J/cm^2$, 1.2 $J/cm^2$ to 1.3 $J/cm^2$, or 1.3 $J/cm^2$ to 1.5 $J/cm^2$. Within the above ranges, sufficient laser thermal effects can be generated to allow the first doping elements in the glass layer 31 to diffuse into the initial second doped conductive layer 43 under the laser thermal effect. And within the above ranges, the diffusion degree of the first doping elements in the glass layer 31 is not too large, which prevents excessive diffusion of the first doping elements into the first doped conductive layer 120, resulting in an increase in the doping element concentration of the formed first doped conductive layer 120.

In some embodiments, the parameters of the laser process can also be controlled so that the first doping elements also diffuses into the first doped conductive layer 120, to form multiple third portions 13 (referring to FIG. 4) directly opposite to the multiple first portions 11 and multiple fourth portions 14 (referring to FIG. 4) directly opposite to the multiple second portions 12 in the first doped conductive layer 120. In the operation of forming the multiple second portion 12 by the laser process, a part of the first doping elements diffuses into a part of the first doped conductive layer 120 directly opposite to the multiple second portions 12 to form the multiple fourth portions 14 with relatively high doping element concentration. The other part of the first doped conductive layer 120 forms the multiple third portions 13 with relatively low doping element concentration.

In some embodiments, the parameters of the laser process can also be controlled to cause recrystallization of the grains formed in the multiple second portion 12, resulting in a smaller average grain size in each of the multiple second portions 12 compared to the average grain size in each of the multiple first portions 11. In this way, more first doping elements are diffused into the multiple second portions 12, which achieves a higher doping element concentration of the multiple second portions 12 than in the multiple first portions 11. In some embodiments, the parameters of the laser process can also be controlled to cause recrystallization of the grains in both the multiple second portions 12 and the multiple fourth portions 14, to achieve an average grain size of each of the multiple fourth portions 14 that is smaller than that of each of the multiple third portions 13, and achieve a doping element concentration greater than that of each of the multiple third portions 13.

In some embodiments, the laser used in the laser process can be any of infrared laser, green laser, or ultraviolet laser. These lasers can be generated by any of a CO2 laser device, an excimer laser device, a Ti sapphire laser device, a semiconductor laser device, a copper vapor laser device, or other laser devices that can emit lasers.

The laser emitted by the laser device irradiates the surface of glass layer 31, and under the thermal effect of the laser, the first doping elements in glass layer 31 diffuse into the initial second doped conductive layer 43.

In some embodiments, after the multiple first portions 11 and the multiple second portions 12 are formed, the sacrificial layer and the glass layer 31 are removed. In some embodiments, the acid washing process can be used to remove the glass layer 31, for example, HCL solution or HF solution can be used to clean and remove the sacrificial layer and the glass layer 31.

Figure 26:
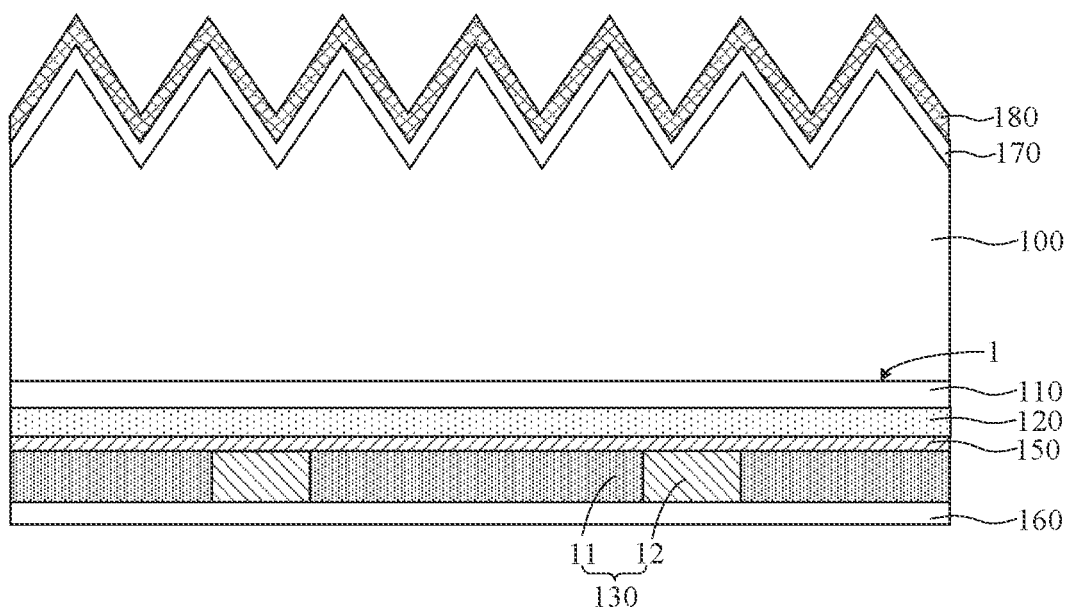
FIG. 26 is a cross-sectional view of a solar cell corresponding to an operation of forming a first passivation layer and a second passivation layer in another method for preparing a solar cell provided according to an embodiment of the present application.

Referring to FIG. 26, in some embodiments, the method for preparing a solar cell further includes forming a first passivation layer 160 on a surface of the second doped conductive layer 130 away from the substrate 100. In some embodiments, the first passivation layer 160 may be a single-layer structure. In some embodiments, the first passivation layer 160 may also be a multilayer structure.

In some embodiments, the first passivation layer 160 is a single-layer structure, and the material of the first passivation layer 160 may be one of silicon oxide, aluminum oxide, silicon nitride or silicon oxynitride. In some embodiments, the first passivation layer 160 is a multilayer structure, and the material of the first passivation layer 160 may be at least one of silicon oxide, aluminum oxide, silicon nitride or silicon oxynitride.

In some embodiments, the operation of forming the first passivation layer 160 includes forming the first passivation layer 160 on a surface of the second doped conductive layer 130 by using plasma enhanced chemical vapor deposition (PECVD).

In some embodiments, the method further includes forming a second passivation layer 180 on the surface of the emitter 170. The second passivation layer 180 can achieve desirable passivation effect. In some embodiments, the second passivation layer 180 may be a single-layer structure. In some implementations, the second passivation layer 180 may also be a multilayer structure.

In some embodiments, the second passivation layer 180 is a single-layer structure, and the material of the second passivation layer 180 may be one of silicon oxide, aluminum oxide, silicon nitride or silicon oxynitride. In some embodiments, the second passivation layer 180 is a multilayer structure, and the material of the second passivation layer 180 may be at least one of silicon oxide, aluminum oxide, silicon nitride or silicon oxynitride.

In some embodiments, the second passivation layer 180 is formed on the surface of the emitter 170 by the PECVD process.

Referring to FIG. 9, multiple first electrodes corresponding, respectively, to the multiple second portions are formed, and each of the multiple first electrodes 140 extends along the predetermined direction X. Each of the multiple first electrodes 140 is in electrical contact with the corresponding second portion 12.

In some embodiments, the operation of forming the first electrode 140 includes the following operations.

Metal paste is formed on a surface of each of the multiple second portions 100 away from the substrate 100. In some embodiments, a screen-printing process can be used to print metal paste on a part of the surface of the first passivation layer 160 directly opposite to the multiple second portions 12. In some embodiments, the metal paste includes at least one of silver, aluminum, copper, tin, gold, lead, or nickel.

Sintering process is performed on the metal paste to burn through a part of the metal paste along the thickness direction of the metal paste from the surface of each of the multiple second portion 12 away from the substrate 100, to form the multiple first electrodes 140. In some embodiments, the metal paste contains materials with high corrosive components such as glass. Therefore, during the sintering process, the corrosive components will corrode the first passivation layer 160 and a part of the multiple second portions 12, which causes the metal paste to penetrate the first passivation layer 160 and the part of the multiple second portions 12.

In some embodiments, the method further includes forming a second electrode 190.

The second electrode 190 penetrates through the second passivation layer 180 to be in electrical contact with the emitter 170. In some embodiments, the operation of forming the second electrode 190 can be the same as the operation of forming the first electrode 140, and reference is made to the description of the operation of forming the first electrode 140.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "has," "having," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

In addition, when parts such as a layer, a film, a region, or a plate is referred to as being "on" another part, it may be "directly on" another part or may have another part present therebetween. In addition, when a part of a layer, film, region, plate, etc., is "directly on" another part, it means that no other part is positioned therebetween.

Although the present application is disclosed above with preferred embodiments, it is not used to limit the claims. Any person skilled in the art may make some possible changes and modifications without departing from the concept of the present application. The scope of protection shall be subject to the scope defined by the claims of the present application. In addition, the embodiments and the accompanying drawings in the specification of the present application are only illustrative examples, which will not limit the scope protected by the claims of the present application.

Those of ordinary skill in the art can understand that the above embodiments are specific examples for realizing the present application, and in actual disclosures, various changes may be made in shape and details without departing from the spirit and range of the present application. Any person skilled in the art can make their own changes and modifications without departing from the spirit and scope of the present application. Therefore, the protection scope of the present application should be subject to the scope defined by the claims.

What is claimed is:

1. A solar cell, comprising:
a substrate having a first surface;
a tunneling layer formed on the first surface;
a first doped conductive layer formed on the tunneling layer;
a second doped conductive layer formed on the first doped conductive layer, wherein the second doped conductive layer comprises: a plurality of first portions and a plurality of second portions arranged alternately in a direction perpendicular to a predetermined direction and perpendicular to a thickness direction of the second doped conductive layer, each of the plurality of first portions and the plurality of second portions extends along the predetermined direction, a doping element concentration of the first doped conductive layer is lower than a doping element concentration of each of the plurality of first portions, and the doping element concentration of each of the plurality of first portions is lower than a doping element concentration of each of the plurality of second portions, wherein the second doped conductive layer is configured to enable carriers in each of the plurality of first portions to be transported to a respective second portion in the plurality of second portions; wherein the predetermined direction is parallel to the first surface, and the first doped conductive layer has doping element of a same type as the substrate, and the second doped conductive layer has doping element of a same type as the substrate; and
a plurality of first electrodes corresponding, respectively, to the plurality of second portions, wherein each of the plurality of first electrodes extends along the predetermined direction, and each of the plurality of first electrodes is in electrical contact with a corresponding second portion of the plurality of second portions;
wherein the first doped conductive layer includes a plurality of third portions and a plurality of fourth portions arranged alternately in a direction perpendicular to the predetermined direction and perpendicular to a thickness direction of the second doped conductive layer, and each of the plurality of third portions and the plurality of fourth portions extends along the predetermined direction; each of the plurality of third portions is disposed directly opposite to a corresponding one of the plurality of first portions, each of the plurality of fourth portions is disposed directly opposite to a corresponding one of the plurality of second portions, and a doping element concentration of each of the plurality of third portions is lower than a doping element concentration of each of the plurality of fourth portions.

2. The solar cell according to claim 1, wherein a ratio of the doping element concentration of each of the plurality of first portions to the doping element concentration of each of the plurality of second portions ranges from 1:50 to 3:4.

3. The solar cell according to claim 2, wherein a ratio of the doping element concentration of the first doped conductive layer to the doping element concentration of each of the plurality of second portions ranges from 1:100 to 1:2.

4. The solar cell according to claim 1, wherein in response to the first doped conductive layer having N-type doping elements, a ratio of the doping element concentration of each of the plurality of third portions to the doping element concentration of each of the plurality of fourth portions ranges from 1:30 to 5:6; in response to the first doped conductive layer having P-type doping elements, the ratio of the doping element concentration of each of the plurality of third portions to the doping element concentration of each of the plurality of fourth portions ranges from 1:100 to 2:3.

5. The solar cell according to claim 4, wherein a ratio of the doping element concentration of each of the plurality of fourth portions to the doping element concentration of each of the plurality of second portions is 1:10 to 5:6.

6. The solar cell according to claim 1, wherein the first doped conductive layer and the second doped conductive layer both have P-type doping elements, the doping element concentration of each of the plurality of first portions ranges from $5 \times 10^{18}$ atom/cm$^3$ to $5 \times 10^{19}$ atom/cm$^3$, the doping element concentration of each of the plurality of second portions ranges from $5 \times 10^{19}$ atom/cm$^3$ to $3 \times 10^{20}$ atom/cm$^3$, and the doping element concentration of the first doped conductive layer ranges from $1 \times 10^{18}$ atom/cm$^3$ to $4.5 \times 10^{19}$ atom/cm$^3$.

7. The solar cell according to claim 1, wherein the first doped conductive layer and the second doped conductive layer both have N-type doping elements, the doping element concentration of each of the plurality of first portions ranges from $1 \times 10^{20}$ atom/cm$^3$ to $2 \times 10^{21}$ atom/cm$^3$, the doping element concentration of each of the plurality of second portions ranges from $2 \times 10^{20}$ atom/cm$^3$ to $5 \times 10^{21}$ atom/cm$^3$, and the doping element concentration of the first doped conductive layer ranges from $5 \times 10^{19}$ atom/cm$^3$ to $5 \times 10^{20}$ atom/cm$^3$.

8. The solar cell according to claim 1, further including a blocking layer located between the first doped conductive layer and the second doped conductive layer, wherein a surface of the blocking layer facing towards the substrate is in contact with a surface of the first doped conductive layer away from the substrate, and a surface of the blocking layer away from the substrate is in contact with a surface of the second doped conductive layer facing towards the substrate.

9. The solar cell according to claim 8, wherein the surface of the blocking layer away from the substrate is in contact with each of the plurality of second portions, and an orthographic projection of the blocking layer on the first surface completely overlaps with an orthographic projection of each of the plurality of second portions on the first surface.

10. The solar cell according to claim 8, wherein the surface of the blocking layer away from the substrate is in contact with each of the plurality of first portions and each of the plurality of second portions, and an orthographic projection of the blocking layer on the first surface completely overlaps with an orthographic projection of each of the plurality of first portions on the first surface and an orthographic projection of each of the plurality of second portions on the first surface.

11. The solar cell according to claim 8, wherein a material of the blocking layer includes at least one of silicon oxide, silicon nitride, silicon oxynitride, silicon carbide or magnesium fluoride.

12. The solar cell according to claim 11, wherein a material of the first doped conductive layer includes at least one of amorphous silicon, polycrystalline silicon, or silicon carbide, and a material of the second doped conductive layer includes at least one of amorphous silicon, polycrystalline silicon, or silicon carbide.

13. The solar cell according to claim 12, wherein the first doped conductive layer is composed of a first polycrystalline silicon, each of the plurality of first portions is composed of a second polycrystalline silicon, and each of the plurality of the second portions is composed of a third polycrystalline silicon; an average grain size of the first polycrystalline silicon is greater than an average grain size of the second polycrystalline silicon, and is greater than an average grain size of the third polycrystalline silicon.

14. The solar cell according to claim 1, wherein each of the plurality of third portions is composed of a fourth polycrystalline silicon, each of the plurality of fourth portions is composed of a fifth polycrystalline silicon, each of the plurality of first portions is composed of a second polycrystalline silicon, and each of the plurality of second portions is composed of a third polycrystalline silicon; wherein an average grain size of the fourth polycrystalline silicon is greater than an average grain size of the fifth polycrystalline silicon, the average grain size of the fifth polycrystalline silicon is greater than an average grain size of the third polycrystalline silicon, and an average grain size of the second polycrystalline silicon is greater than the average grain size of the third polycrystalline silicon.

15. The solar cell according to claim 1, wherein the substrate has N-type doping elements, each of the plurality of second portions includes a main body portion doped with N-type doping elements and a reverse doped portion located in the main body portion and doped with P-type doping elements, and a volume proportion of the reverse doped portion in the main body portion is less than 50%.

16. The solar cell according to claim 1, wherein a ratio of a thickness of the first doped conductive layer to a thickness of the second doped conductive layer ranges from 2:1 to 1:12.

17. A photovoltaic module, comprising:
at least one cell string, wherein the at least one cell string is formed by connecting a plurality of solar cells with each other, the plurality of solar cells includes at least one solar cell according to claim 1;
at least one encapsulation layer configured to cover the at least one cell string;
at least one cover plate configured to cover the at least one encapsulation layer.

\* \* \* \* \*